US012674976B2

(12) United States Patent
Luque Lopez

(10) Patent No.: US 12,674,976 B2
(45) Date of Patent: Jul. 7, 2026

(54) MONOLITHIC MIRROR AND METHOD FOR DESIGNING SAME

(71) Applicant: SILBAT ENERGY STORAGE SOLUTIONS, S.L., Madrid (ES)

(72) Inventor: Antonio Ignacio Luque Lopez, Madrid (ES)

(73) Assignee: SILBAT ENERGY SOLUTIONS, S.L., Madrid (ES)

( * ) Notice: Subject to any disclaimer, the term of this patent is extended or adjusted under 35 U.S.C. 154(b) by 377 days.

(21) Appl. No.: 18/253,479

(22) PCT Filed: Nov. 20, 2020

(86) PCT No.: PCT/EP2020/082971
§ 371 (c)(1),
(2) Date: May 18, 2023

(87) PCT Pub. No.: WO2022/106033
PCT Pub. Date: May 27, 2022

(65) Prior Publication Data
US 2023/0418051 A1 Dec. 28, 2023

(51) Int. Cl.
| *G02B 27/00* | (2006.01) |
| *G02B 1/00* | (2006.01) |
| *G02B 5/08* | (2006.01) |
| *H02S 10/30* | (2014.01) |
| *H10F 77/42* | (2025.01) |

(52) U.S. Cl.
CPC ......... *G02B 27/0012* (2013.01); *G02B 1/005* (2013.01); *G02B 5/0858* (2013.01); *H02S 10/30* (2014.12); *H10F 77/488* (2025.01)

(58) Field of Classification Search
CPC .. G02B 27/0012; G02B 1/005; G02B 5/0825; G02B 5/0858; G02B 5/282–285
See application file for complete search history.

(56) References Cited

U.S. PATENT DOCUMENTS

| 5,569,332 A | 10/1996 | Glatfelter |
| 2003/0029496 A1 | 2/2003 | Wada |
| 2010/0117059 A1* | 5/2010 | Chrastina ................ G02F 1/017 257/19 |
| 2011/0203663 A1 | 8/2011 | Prather |

(Continued)

FOREIGN PATENT DOCUMENTS

| CN | 1577902 | 2/2005 |
| CN | 102681056 A | 9/2012 |

(Continued)

OTHER PUBLICATIONS

Joannopouos, J.D. et al., "Photonic Crystals: Molding the Flow of Light", Princeton University Press, 2005, pp. 37-54.

(Continued)

*Primary Examiner* — Jonathan Y Jung
(74) *Attorney, Agent, or Firm* — Kramer & Amado, P.C.

(57) ABSTRACT

The present invention refers to a mirror comprising a plurality of one-dimensional photonic crystals, the mirror having very high reflectance in a very broad range of wavelengths, a broad range of directions, even hemispheric, and all the polarizations of the incident photons. The invention also refers to a method for designing said mirror and a photovoltaic cell comprising such a mirror.

23 Claims, 8 Drawing Sheets

(56) References Cited

U.S. PATENT DOCUMENTS

| | | | |
|---|---|---|---|
| 2012/0125429 A1 | 5/2012 | Myong | |
| 2013/0104983 A1 | 5/2013 | Abrams | |
| 2016/0252652 A1* | 9/2016 | Shen | G02F 1/0147 |
| | | | 359/485.02 |
| 2018/0045865 A1* | 2/2018 | Banerjee | G02B 5/085 |
| 2019/0041694 A1 | 2/2019 | Li | |
| 2020/0158931 A1* | 5/2020 | Guo | B32B 7/02 |

FOREIGN PATENT DOCUMENTS

| | | |
|---|---|---|
| CN | 104076530 A | 10/2014 |
| CN | 108873111 A | 11/2018 |
| CN | 110034720 A | 7/2019 |
| CN | 108873111 B | 4/2020 |
| JP | S62234105 A | 10/1987 |
| JP | 2012-518205 A | 8/2012 |
| JP | 2019-174695 A | 10/2019 |
| WO | 01/37006 A1 | 5/2001 |

OTHER PUBLICATIONS

Abdelaziz, K.B. et al., "A Broad Omnidirectional Reflection Band Obtained from Deformed Fibonacci Quasi-Periodic One Dimensional Photonic Crystals", Journal of Optics a-Pure and Applied Optics 7 (10), 2005, pp. 544-549, doi:10.1088/1464-4257/7/10/005.

Born, M. et al., "Principles of Optics", Pergamon Press, Oxford, 1975, pp. 55-70.

Carniglia, C.K., "Perfect Mirrors—From a Coating Designer's Point of View", Laser-Induced Damage in Optical Materials: 68-84 1999, Proc. of SPIE vol. 3902, 2000.

Qiang, H., Jiang, L., Li, X.: "Design of broad omnidirectional total reflectors based on one-dimensional dielectric and magnetic Photonic Crystals". Optics and Laser Technology 42(1), 105-109 (2010). doi:10.1016/j.optlastec.2009.05.006.

Samah G Babiker et al., "Design of a one-dimensional Si/SiO2 Photonic Crystals Filter for Thermophotovoltaic Application," INMIC, Dec. 2013, pp. 177-181.

J KRC et al., "Modulated Photonic-crystal Structures as Broadband Back Reflectors in Thin-Film Solar Cells," Applied Physics Letters, Apr. 14, 2009, vol. 94, No. 15.

Chinese Office Action issued in corresponding Chinese Patent Application No. 202080107389.3 mailed on Jan. 5, 2026.

* cited by examiner

MONOLITHIC MIRROR AND METHOD FOR DESIGNING SAME

TECHNICAL FIELD OF THE INVENTION

The present invention refers to a mirror comprising a plurality of one-dimensional photonic crystals, the mirror having very high reflectance in a very broad range of wavelengths, a broad range of directions, even hemispheric, and all the polarizations of the incident photons. The invention also refers to a method for designing and manufacturing said mirror and a photovoltaic cell comprising such a mirror.

BACKGROUND OF THE INVENTION

Photonic crystals are structures where a unit cell formed by one or several materials of variable index of refraction is repeated periodically and indefinitely in space. Photonic crystals may contain forbidden bands or energy bandgaps where no photon can exist. A photon having an energy within said bandgap, incident on the photonic crystal, cannot enter the photonic crystal and therefore is totally reflected, that is, the reflectance of the photonic crystal at said energy is equal to one. An introduction to photonic crystals can be found in Joannopoulos, J. D., Meade, R. D.: "*Photonic Crystals: Molding the Flow of Light*", Princeton University Press, (2005).

In one-dimensional (1D) photonic crystals, the variation of the index of refraction only occurs in one dimension, called z, and the unit cells are usually formed by two layers of dielectrics of different indices of refraction, usually called high (H) and low (L). 1D-photonic crystals also have bandgaps, although their energetic position varies with the angle of incidence (θ) of the photons with respect to the z-axis and with their polarization. In practice, photonic crystals have a finite number of unit cells and this reduces somewhat the reflectance in the bandgaps, although usually the value of the reflectance remains very close to unity. In contrast, in three-dimensional (3D) photonic crystals, whose index of refraction forms a periodic structure that varies on the three axes of the space, the bandgaps, if they exist, are independent of the angle of incidence. However, few existing spatial structures are able to produce proper bandgaps and they are almost unsuitable for large commercialization.

In 1D photonic crystals, a reference plane is formed containing the z axis and the direction of the photon incident on the crystal, that is, according to the wavevector k of the electromagnetic planewave representing it. This plane may be called the yz plane. Any planewave is a linear combination of a transversal electric (TE or s-polarized) planewave, with its electric field vector normal to the plane yz, and a transversal magnetic (TM or p-polarized) planewave, with its magnetic field normal to the plane yz. As already stated, the bandgap position changes with the angle of incidence (θ) and with the TE or TM polarizations.

The range of energies of these bandgaps may be expressed by a range of photon wavelengths in the vacuum ($\lambda_0$), the relation between the wavelength and the energy being given by the well known formula $$\lambda_0 = \frac{hc}{eE},$$

h being the Planck constant, c being the speed of light in the vacuum, e being the charge of the electron (all in the International System of units), E being the energy in electron volts. In this specification, the energy span of the bandgaps will be expressed in terms of wavelengths in the vacuum ($\lambda_0$). Therefore, the reflectance (R) of a photonic crystal as a function of the photon wavelength in the vacuum ($\lambda_0$) is closely represented by a rectangle of height unity and width equal to the bandgap span. The height of this rectangle is one, although in the corners some rounding appears, the rounding being more marked as the number of unit cells in the photonic crystal decreases. The base of the rectangle is called the total reflection band. The edges of the rectangle are called leading edge and trailing edge (the trailing edge being the edge at the right, of higher wavelength). Outside this rectangle, beyond the edges, regions of wavy reflectance appear, wherein the reflectance is lower than one everywhere.

Under normal incidence (θ=0) no difference is found for TE and TM polarizations because the z axis and the direction of photons is coincident and any plane containing the z axis may be considered as a TE or a TM plane. For incidence inclined a non-zero angle (θ), the total reflection band is blue-shifted, that is, shifted towards the lower wavelengths, and its width is increased for TE polarization and reduced for TM polarization. The trailing edge is also blue-shifted for TE and TM polarizations, but it is the TM polarization the most shifted. These modifications are stronger for bigger angles and strongest for levelling (θ=π/2 rad) incidence.

Despite the shifting of the total reflection bands in 1D photonic crystals, there is a range of wavelengths with total reflection that is common to the bands obtained for normal incidence, for TE levelling incidence and for TM levelling incidence. It is the band of hemispheric (or omnidirectional) total reflection, which will be called herein "hemispheric total reflection band". In general the hemispheric total reflection band is relatively narrow, thus being the leading edge of this hemispheric total reflection band the leading edge of the total reflection band under normal incidence (θ=0 rad) and the trailing edge of this hemispheric total reflection band being the trailing edge of the total reflection band under levelling TM polarization (θ=π/2 rad). However, by slight deformation of the periodic-structure of the photonic crystal (now becoming a pseudo crystal) the hemispheric total reflection band can be somewhat enlarged (Abdelaziz, K. B., Zaghdoudi, J., Kanzari, M., Rezig, B.: "*A broad omnidirectional reflection band obtained from deformed Fibonacci quasi-periodic one dimensional Photonic Crystals*". Journal of Optics a-Pure and Applied Optics 7(10), 544-549 (2005). doi: 10.1088/1464-4258/7/10/005).

The transmittance (T), in absence of absorption (this is the case of the present invention), is one minus the reflectance (T=1−R) and is thus zero in the zones of total reflection and wavy outside them, meaning that some photons are transmitted but not all.

A 1D photonic crystal is a layered structure. Layered structures have been studied since long ago by the method of characteristic matrices and a classical book is that of Born and Wolf (Born, M., Wolf, E.: "*Principles of Optics*". Pergamon Press, Oxford (1975)). According to this method, each photonic crystal has a characteristic matrix in which two Chebyshev polynomials of the second kind $U_{N-1}$ (α) and $U_{N-2}$ (α) appear, of argument α and degrees N−1 and N−2, being N the number of unit cells in the photonic crystal. The argument $\alpha_{TE|TM}$ ($\lambda_0$, θ, $n_a$, $n_b$, $h_a$, $h_b$) is a function depending on: the vacuum wavelength ($\lambda_0$) of the incident photons, the angle of incidence (θ), the high and low refraction indices ($n_a$, $n_b$) of the unit cell materials and the thicknesses of the layers ($h_a$, $h_b$) of the unit cell. The argument (α) also depends on the polarization TE or TM of the incident photons. On normal incidence ($\theta$=0) the argument ($\alpha$) is the same for TE and TM which are physically undistinguishable, as previously pointed out, and the sub index (TE|TM) of the argument ($\alpha$) may be omitted. It is to be noticed that the number of unit cells forming the photonic crystal does not appear in the Chebyshev argument.

Multiple photonic crystals have been occasionally proposed in the academic literature. The use of several photonic crystals may widen the breath of the total reflection band. Carniglia C K.: "*Perfect mirrors—from a coating designer's point of view*". Laser-Induced Damage in Optical Materials: 68-84 1999, Proc. of SPIE Vol. 3902 (2000) expresses this concept and presents several unit cell structures. According to this disclosure, a stack of 4 photonic crystals with "wavelength pass" (LWP) filter unit cells leads to a calculated total reflection band from about 0.382 μm to 0.721 μm, where its efficiency is not calculated although the unit cells aim at a reflectance of at least 0.95, certainly exceeded by the stack. The unit cells are designed to have a thickness of the low (L) layer equal to a quarter of wave (also referred to as quarterwave in the mentioned paper) at a designed "central" value of the vacuum wavelength of each photonic crystal. However, such a configuration provides a narrow total reflection band.

In Qiang, H., Jiang, L., Li, X.: "*Design of broad omni-directional total reflectors based on one-dimensional dielectric and magnetic Photonic Crystals*". Optics and Laser Technology 42(1), 105-109 (2010). doi:10.1016/j.optlastec.2009.05.006) for the purpose of enlarging the span of the hemispheric total reflection band another example of the use of multiple photonic crystals is offered. However, the procedure to achieve this enlargement is fully theoretical and based on the deposition of layers of magnetic materials (thus having a permeability different from one), of undefined nature and whose combined values of permittivity and permeability are probably impossible to achieve.

Patent Application US2012125429A1 discloses a solar cell with different layers and a 3D photonic crystal stuck to its back surface whose purpose is reflecting the unused light back to the cell body and thus increase its efficiency. As already mentioned, 3D photonic crystals may present a total reflection band which is intrinsically hemispheric (or omnidirectional). The breadth of the total reflection band—which extends from the visible to near infrared—is enough to increase the solar cell efficiency but is incomparably narrower than the span necessary for other applications, such as thermophotovoltaics, requiring high reflectance in the mid infrared.

Patent Application US2013104983A1 describes a procedure to improve the efficiency of any solar cell by the application of an optimized management of the light. In this management a variety of methods are used including the use of a single photonic crystal.

Document CN104076530A describes a procedure to improve the efficiency of a solar cell by means of a stack of layers doped with luminescent materials to emit strongly in certain wavelength which is considered optimal. Furthermore these layers may form a single photonic crystal.

Patent Application US2011203663A1 discloses a solar cell with a variety of optical structures intended to capture the light into the cell and so increase its efficiency. It includes an anti-reflection coating, a 3D photonic crystal on the front of the solar cell and a metal diffraction grating and a 1D photonic crystal on the grating and integrated in it, in the back face.

In all the three last documents mentioned, the wavelength span on which they focus their interest refers to the visible and the near IR (less than 2 μm) while the present invention provides hemispheric mirrors with total reflectance in spans that can comprise from the visible to the mid infrared (more than 20 μm). Furthermore, the three last documents mentioned only include a single photonic crystal, absolutely unable to yield the span achieved with the multiple photonic crystal mirror according to the present invention. This broad span is necessary for many applications, including, among others, the energy storage in molten metals.

SUMMARY OF THE INVENTION

The present invention provides methods to design and/or produce a mirror having a hemispheric total reflection band of broadest span. The claimed methods are more effective and practicable than any other method proposed thus far.

The present invention defines methods for designing a mirror according to claims 1 and 2, a method for manufacturing a mirror according to claim 4, a mirror according to claim 11, a photovoltaic cell according to claim 12 and a thermal insulation according to claim 14. The dependent claims define preferred embodiments of the invention.

In a first inventive aspect the invention defines a method for designing a mirror having maximum reflectance in a predefined vacuum wavelength range ($[\lambda_A, \lambda_B]$) for incident radiation with an angle of incidence lower than or equal to a predefined maximum angle of incidence ($\theta_{max}$). The mirror comprises a plurality of one-dimensional photonic crystals forming layers, wherein each photonic crystal comprises a plurality of unit cells repeated identically a prescribed number of times, each unit cell comprising a layer of a first dielectric material and a layer of a second dielectric material, the first and second dielectric materials having different indices of refraction. The reflectance of each photonic crystal as a function of vacuum wavelength ($\lambda_0$) shows the shape of a rectangular pulse in an interval $$\left(\lambda_0^L, \lambda_0^T\right)$$

between a leading edge wavelength value $$\left(\lambda_0^L\right)$$

and a trailing edge wavelength value $$\left(\lambda_0^T\right),$$

said pulse in said interval being identified as total reflection band of the photonic crystal. The leading edge wavelength value and the trailing edge wavelength value are dependent on the angle of incidence ($\theta$) and on the polarization of the incident radiation, the polarization being transversal electric (TE) or transversal magnetic (TM).

Thus, a layer of first dielectric material and a layer of second dielectric material form the unit cell of a photonic crystal. Said unit cell is repeated $N_i$ times to form a photonic crystal of $2N_i$ layers of dielectric materials, namely $N_i$ layers of the first dielectric material and $N_i$ layers of the second dielectric material. Subindex i in the number of unit cells reflects the fact that the photonic crystals composing the mirror may have a different number of unit cells.

When two unit cells are attached one to another, there is no coincidence of layers of the same dielectric material. On the contrary, the disposition of the layers in a photonic crystal is always alternating the first and second dielectric materials, even in the coupling of adjacent unit cells, being the arrangement of the layers always a correlative distribution of layers of the two different materials.

In the context of the present invention, transversal magnetic polarization (TM) is the polarization in which the magnetic field of the electromagnetic wave of the photon is perpendicular to the plane formed by the direction of the incident photon and the normal to the layers of the photonic crystal.

It should be understood that the notation "first dielectric material" and "second dielectric material" is only to distinguish the two materials in the unit cell of a photonic crystal. However, this notation is not intended to mean a specific order of the two dielectric materials in the unit cell of the photonic crystal. Thus, when the layers of dielectric materials are deposited on a substrate, either the first or the second dielectric material may be firstly deposited on the substrate. The dielectric materials are also named herein high and low index of refraction materials, the high index of refraction material being the dielectric material having the higher index of refraction compared to the other dielectric material in the unit cell of the photonic crystal. Each index of refraction is given by the material, thus being the values of the indexes of refraction predefined parameters which correspond to the previous election of the materials of the layers of the unit cells of the photonic crystals for the design of the multilayer mirror performed by the method of the first inventive aspect. Furthermore, different couples of materials may be used for the different photonic crystals among the plurality of photonic crystals in the mirror and the subindex i is used to distinguish them.

The method according to the first inventive aspect, in a first embodiment, comprises the following steps for $i=1, \ldots m$:

(a) setting a leading edge wavelength value $$\left(\lambda_{0l,i}^{L}\right)$$

of the total reflection band of the i-th photonic crystal for $\theta=0$ and selecting the first and second dielectric materials to form the unit cell of said i-th photonic crystal;

(b) determining a first thickness ($h_{al,i}$) for the layer of first dielectric material of the i-th photonic crystal and a second thickness ($h_{bl,i}$) for the layer of second dielectric material of the i-th photonic crystal as:

$$h_{al,i} = \frac{\lambda_{0l,i}^{L}}{4\pi n_{al,i}} \left\{ 2\pi - \arccos\left[ \frac{\left(1 - \frac{n_{al,i}}{n_{bl,i}}\right)^2 - 4\frac{n_{al,i}}{n_{bl,i}}}{\left(1 + \frac{n_{al,i}}{n_{bl,i}}\right)^2} \right] \right\}$$

$$h_{bl,i} = h_{al,i} \frac{n_{al,i}}{n_{bl,i}}$$

wherein $n_{al,i}$ and $n_{bl,i}$ are, respectively, the indices of refraction of the first dielectric material and the second dielectric material selected for the i-th photonic crystal; and

(c) with the values of the first thickness ($h_{al,i}$) and the second thickness ($h_{bl,i}$) calculated in step (b), determining the trailing edge wavelength value $$\left(\lambda_{0l,i}^{T}\right)$$

of the total reflection band of the i-th photonic crystal as $$\lambda_{0l,i}^{T} = \frac{8 n_{al,i} h_{al,i} \cos(\theta_{al,i})}{X(1 + r)}$$

wherein parameter X is obtained by solving in X the equation $\alpha_{TM}+1=0$ for the predefined maximum angle of incidence ($\theta_{max}$) and for transversal magnetic (TM) polarization, wherein said equation is solved by an iteration method whose initial value is $X=1$, wherein $$\alpha_{TM} = \cos(\pi X/2)\frac{(1+Z)^2}{4Z} - \cos(\pi r X/2)\frac{(1-Z)^2}{4Z}$$

$$Z = n_{bl,i} \cos(\theta_{al,i})/(n_{al,i}\cos(\theta_{bl,i}))$$

$$r = \frac{\cos^2(\theta_{al,i}) - \left(\frac{Z h_{bl,i}}{h_{al,i}}\right)\cos^2(\theta_{bl,i})}{\cos^2(\theta_{al,i}) + \left(\frac{Z h_{bl,i}}{h_{al,i}}\right)\cos^2(\theta_{bl,i})}$$

$$\theta_{al,i} = \arcsin\left(\frac{\sin(\theta_{max})}{n_{al,i}}\right)$$

$$\theta_{bl,i} = \arcsin\left(\frac{\sin(\theta_{max})}{n_{bl,i}}\right)$$

wherein in step (a) the leading edge wavelength value $$\left(\lambda_{0l,i}^{L}\right)$$

is set to:

a value equal to $\lambda_A$, for $i=1$, and a value equal to the trailing edge wavelength value $$\left(\lambda_{0l,i-1}^{T}\right)$$

of the total reflection band of the (i−1)-th photonic crystal for $\theta=\theta_{max}$ and TM polarization, for $i>1$, wherein m is the number of the photonic crystal which fulfils that the trailing edge wavelength value $$\left(\lambda_{0l,m}^{T}\right)$$

of the total reflection band of said m-th photonic crystal for $\theta=\theta_{max}$ and TM polarization is equal to or greater than $\lambda_B$.

The method according to the first inventive aspect, in a second embodiment, comprises the following steps for $i=1, \ldots m$:

(a) setting a trailing edge wavelength value $$\left(\lambda_{0t,i}^{T}\right)$$

of the total reflection band of the i-th photonic crystal for $\theta=\theta_{max}$ and TM polarization and selecting the first and second dielectric materials to form the unit cell of said i-th photonic crystal;

(b) determining a first thickness ($h_{at,i}$) for the layer of first dielectric material of the i-th photonic crystal and a second thickness ($h_{bt,i}$) for the layer of second dielectric material of the i-th photonic crystal as:

$$h_{at,i} = \frac{\lambda_{0t,i}^{T}}{4\pi n_{at,i}} \times \left\{ arc\ cos\left[ \frac{\left(1 - \frac{n_{bt,i}\cos(\theta_{at,i})}{n_{at,i}\cos(\theta_{bt,i})}\right)^2 - \frac{4n_{bt,i}\cos(\theta_{at,i})}{n_{at,i}\cos(\theta_{bt,i})}}{\left(1 + \frac{n_{bt,i}\cos(\theta_{at,i})}{n_{at,i}\cos(\theta_{bt,i})}\right)^2} \right] \right\}$$

$$h_{bt,i} = h_{at,i}\frac{n_{at,i}\cos(\theta_{at,i})}{n_{bt,i}\cos(\theta_{bt,i})}$$

wherein $n_{at,i}$ and $n_{bt,i}$ are, respectively, the indices of refraction of the first dielectric material and the second dielectric material selected for the i-th photonic crystal, wherein $$\theta_{at,i} = \arcsin\left(\frac{\sin(\theta_{max})}{n_{at,i}}\right)$$

$$\theta_{bt,i} = \arcsin\left(\frac{\sin(\theta_{max})}{n_{bt,i}}\right)$$

and (c) with the values of the first thickness ($h_{at,i}$) and the second thickness ($h_{bt,i}$) calculated in step (b), determining the leading edge wavelength value $$\left(\lambda_{0t,i}^{L}\right)$$

of the total reflection band of the i-th photonic crystal as $$\lambda_{0t,i}^{L} = \frac{8n_{at,i}h_{at,i}}{X(1+r)}$$

wherein parameter X is obtained by solving in X the equation $\alpha_{TM}+1=0$ for $\theta=0$,
wherein said equation is solved by an iteration method whose initial value is X=3,
wherein $$\alpha_{TM} = \cos(\pi X/2)\frac{(1+Z)^2}{4Z} - \cos(\pi r X/2)\frac{(1-Z)^2}{4Z}$$

$$Z = n_{bt,i}/n_{at,i}$$

$$r = \frac{1 - \left(Zh_{bt,i}/h_{at,i}\right)}{1 + \left(Zh_{bt,i}/h_{at,i}\right)}$$

wherein in step (a) the trailing edge wavelength value $$\left(\lambda_{0t,i}^{T}\right)$$

is set to:

a value equal to $\lambda_B$, for i=1, and a value equal to the leading edge wavelength value of the total reflection band of the (i−1)-th photonic crystal for $\theta=0$, for i>1, wherein m is the number of the photonic crystal which fulfils that the leading edge wavelength value $$\left(\lambda_{0t,m}^{L}\right)$$

of the total reflection of said m-th photonic crystal for $\theta=0$ is equal to or smaller than $\lambda_A$.

Thus, the method according to the first embodiment of the first inventive aspect involves designing the photonic crystals from $\lambda_A$ to $\lambda_B$ by setting a leading edge wavelength value of the photonic crystals, calculating the layers thicknesses and obtaining the trailing edge wavelength value and the method according to the second embodiment of the first inventive aspect involves designing the photonic crystals from $\lambda_B$ to $\lambda_A$ by setting the trailing edge wavelength value of the photonic crystals, calculating the layer thicknesses and obtaining the leading edge wavelength value.

Throughout this document the following notation will be used:

$\alpha_{TM}$ denotes the argument of the second-kind Chebyshev polynomials of the characteristic matrix of the photonic crystals, referred herein as "Chebyshev argument";

$$\lambda_{0l,j}^{L}$$

denotes the leading edge wavelength value of the total reflection band of the j-th photonic crystal of the series of calculations starting in $\lambda_A$;

$$\lambda_{0l,j}^{T}$$

denotes the trailing edge wavelength value of the total reflection band of the j-th photonic crystal of the series of calculations starting in $\lambda_A$;

$h_{al,j}$ and $h_{bl,j}$ respectively denote the thickness of the layer of the first and second materials of the unit cell of the j-th photonic crystal of the series of calculations starting in $\lambda_A$;

$n_{al,j}$ and $n_{bl,j}$ respectively denote the indices of refraction of the first and second materials of the unit cell of the j-th photonic crystal of calculations starting in $\lambda_A$.

$$\lambda_{0t,j}^{L}$$

denotes the leading edge wavelength value of the total reflection band of the j-th photonic crystal of the series of calculations starting in $\lambda_B$;

$$\lambda_{0t,j}^T$$

denotes the trailing edge wavelength value of the total reflection band of the j-th photonic crystal of the series of calculations starting in $\lambda_B$;

$h_{at,j}$ and $h_{bt,j}$ respectively denote the thickness of the layer of the first and second materials of the unit cell of the j-th photonic crystal of the series of calculations starting in $\lambda_B$;

$n_{at,j}$ and $n_{bt,j}$ respectively denote the indices of refraction of the first and second materials of the unit cell of the j-th photonic crystal of calculations starting in $\lambda_B$.

According to the first embodiment, the leading edge $$\left(\lambda_{0l,1}^L\right)$$

of the total reflection band of a first photonic crystal for normal incidence is set as a value equal to the vacuum wavelength at the lower limit ($\lambda_A$) of the predefined vacuum wavelength range ([$\lambda_A,\lambda_B$]). The predefined vacuum wavelength range will be understood as the band on which total reflection is required for a specific application or intended use of the mirror. Similarly, the predefined maximum incidence angle ($\theta_{max}$) will be understood as the highest angle of incident photons for which total reflection is required for a specific application or intended use of the mirror. If $\theta_{max}=\pi/2$, the mirror will present hemispheric or omnidirectional total reflection in all the band from $\lambda_A$ to $\lambda_B$.

A first thickness ($h_{al,1}$) for the layer of first dielectric material and a second thickness ($h_{bl,1}$) for the layer of second dielectric material of the first photonic crystal are determined by applying the following expressions:

$$h_{al,1} = \frac{\lambda_A}{4\pi n_{al,1}}\left\{2\pi - \arccos\left[\frac{\left(1 - \frac{n_{al,1}}{n_{bl,1}}\right)^2 - 4\frac{n_{al,1}}{n_{bl,1}}}{\left(1 + \left(n_{al,1}/n_{bl,1}\right)\right)^2}\right]\right\}$$

$$h_{bl,1} = h_{al,1}n_{al,1}/n_{bl,1}$$

wherein $n_{al,1}$ and $n_{bl,1}$ are the indexes of refraction of the first dielectric material and the second dielectric material selected to form the unit cell of the first photonic crystal.

Once the first thickness ($h_{al,1}$) for the layer of first dielectric material and the second thickness ($h_{bl,1}$) for the layer of second dielectric material are calculated, the trailing edge wavelength value $$\left(\lambda_{0l,1}^T\right)$$

of the total reflection band of the first photonic crystal is determined by applying the following expression:

$$\lambda_{0l,1}^T = \frac{8n_{al,1}h_{al,1}\cos(\theta_{al,1})}{X(1 + r)}$$

wherein parameter X is obtained by solving in X the equation $\alpha_{TM}+1=0$ for the predefined maximum angle of incidence ($\theta_{max}$) and for transversal magnetic (TM) polarization, wherein said equation is solved by an iteration method whose initial value is X=1, and wherein:

$$\alpha_{TM} = \cos(\pi X/2)\frac{(1 + Z)^2}{4Z} - \cos(\pi r X/2)\frac{(1 - Z)^2}{4Z}$$

$$Z = n_{bl,i}\cos(\theta_{al,i})/(n_{al,i}\cos(\theta_{bl,i}))$$

$$r = \frac{\cos^2(\theta_{al,i}) - \left(\frac{Zh_{bl,i}}{h_{al,i}}\right)\cos^2(\theta_{bl,i})}{\cos^2(\theta_{al,i}) + \left(\frac{Zh_{bl,i}}{h_{al,i}}\right)\cos^2(\theta_{bl,i})}$$

$$\theta_{al,i} = \arcsin\left(\frac{\sin(\theta_{max})}{n_{al,i}}\right)$$

$$\theta_{bl,i} = \arcsin\left(\frac{\sin(\theta_{max})}{n_{bl,i}}\right)$$

For TE polarized incident radiation the use in the equation of the TE polarization instead of the TM polarization will yield a wider photonic total reflection band, but it will be ineffective for TM photons and therefore for non-polarized radiation that contains equal amount of TE and TM photons.

As a result of the described steps, the thickness of the layers and the trailing edge wavelength value of the total reflection band of the first photonic crystal are determined.

The calculated trailing edge wavelength value of the first photonic crystal is used to design a subsequent photonic crystal. For this, the first and second dielectric materials to form the unit cell of the second photonic crystal are selected and the leading edge wavelength value $$\left(\lambda_{0l,2}^L\right)$$

of the total reflection band of the second photonic crystal for normal incidence is set as a value equal to the calculated trailing edge wavelength value $$\left(\lambda_{0l,1}^T\right)$$

of the total reflection band of the first photonic crystal for $\theta=\theta_{max}$ and TM polarization. As a result of the mentioned setting of the leading edge wavelength value (or the trailing edge wavelength value in another embodiment), the first and second photonic crystals fit to form a wider total reflection band.

With the set leading edge wavelength value $$\left(\lambda_{0l,2}^L\right),$$

the first thickness ($h_{al,2}$) for the layers of first dielectric material and the second thickness ($h_{bl,2}$) for the layers of second dielectric material are determined as described for the first photonic crystal, using the parameters corresponding to the second photonic crystal.

With the values of the first thickness ($h_{al,2}$) and the second thickness ($h_{bl,2}$) calculated in the previous step, the trailing edge wavelength value $$\left(\lambda_{0l,2}^{T}\right)$$

of the total reflection band of the second photonic crystal is determined as described in connection with the first photonic crystal, using the parameters corresponding to the second photonic crystal.

As a result of these steps, the thickness of the layers of the unit cell and the trailing edge wavelength value of the total reflection band of the second photonic crystal are determined.

This procedure is repeated to design all the photonic crystals which are to be part of the mirror, until for an m-th photonic crystal it is fulfilled that the trailing edge wavelength value $$\left(\lambda_{0l,m}^{T}\right)$$

of the total reflection band for $\theta=\theta_{max}$ and TM polarization is equal to or greater than $\lambda_B$. At said iteration the total reflection bands of the plurality of photonic crystals span the whole width of the predefined vacuum wavelength range, i.e. the range where total reflection is desired ($[\lambda_A, \lambda_B]$).

For the method according to the second embodiment, an iterative process similar to the one disclosed is performed, with the difference that the trailing edge wavelength value $$\left(\lambda_{0t,i}^{T}\right)$$

of the total reflection band of each photonic crystal for $\theta=\theta_{max}$ and TM polarization is set instead of the leading edge wavelength value, and the leading edge wavelength value $$\left(\lambda_{0t,i}^{L}\right)$$

is obtained based on the calculated first thickness ($h_{at,i}$) and second thickness ($h_{bt,i}$), wherein the values of the first thickness ($h_{at,i}$) and the second thickness ($h_{bt,i}$) are obtained using the following expressions:

$$h_{at,i} = \frac{\lambda_{0t,i}^{T}}{4\pi n_{at,i}} \times \left\{ \arccos\left[ \frac{\left(1 - \frac{n_{bt,i}\cos(\theta_{at,i})}{n_{at,i}\cos(\theta_{bt,i})}\right)^2 - \frac{4n_{bt,i}\cos(\theta_{at,i})}{n_{at,i}\cos(\theta_{bt,i})}}{\left(1 + \frac{n_{bt,i}\cos(\theta_{at,i})}{n_{at,i}\cos(\theta_{bt,i})}\right)^2} \right] \right\}$$

$$h_{bt,i} = h_{at,i}\frac{n_{at,i}\cos(\theta_{at,i})}{n_{bt,i}\cos(\theta_{bt,i})}$$

and the leading edge wavelength value $$\left(\lambda_{0t,i}^{L}\right)$$

of the total reflection band of the i-th photonic crystal is calculated as $$\lambda_{0t,i}^{L} = \frac{8n_{at,i}h_{at,i}}{X(1+r)}$$

wherein parameter X is obtained by solving in X the equation $\alpha_{TM}+1=0$ for $\theta=0$, i.e. normal incidence, and wherein said equation is solved by an iteration method whose initial value is X=3, with $$\alpha_{TM} = \cos(\pi X/2)\frac{(1+Z)^2}{4Z} - \cos(\pi r X/2)\frac{(1-Z)^2}{4Z}$$

$$Z = n_{bt,i}/n_{at,i}$$

$$r = \frac{1-(Zh_{bt,i}/h_{at,i})}{1+(Zh_{bt,i}/h_{at,i})}$$

According to the second embodiment, the procedure is repeated to design all the photonic crystals which are to be part of the mirror, until for an m-th photonic crystal it is fulfilled that the leading edge wavelength value $$\left(\lambda_{0t,m}^{L}\right)$$

of the total reflection band of said m-th photonic crystal for $\theta=0$ is equal to or smaller than $\lambda_A$.

The number of unit cells of the photonic crystals is not included in the Chebyshev argument. A real total reflection is theoretically obtained with an infinite number of layers, but in multiple photonic crystal mirrors 7 unit cells may give a total reflection of reflectance of about 0.9999 and with 10 unit cells the reflectance can even reach 0.999999.

The materials in the unit cell of the photonic crystals may differ from one photonic crystal to another. For example, the first dielectric material of photonic crystal "i" may be the same as or different from the first material of photonic crystal "j". Also, the number of unit cells may differ from one photonic crystal to another.

Advantageously, the present invention allows designing and producing a mirror based on the deposit of a plurality of dielectric layers which presents a reflectance virtually equal to 1 for the electromagnetic radiation in a very broad range, that can extend from the visible to the mid infrared (more than 20 μm) and, in addition, the designed mirror presents this unity reflectance for hemispherical incidence of the radiation and both polarizations. For it, the dielectric layers are grouped in several photonic crystals deposited mono-lithically on the same substrate and designed through the methods of the present invention. The method of the present invention allows producing the broadest band of the hemi-spheric total reflection. Also, it is more effective and prac-ticable than any other method proposed thus far.

Today, mirrors with a single photonic crystal deposited on a substrate are frequently used in optics and communica-tions. These mirrors are requested to have a very high reflectance at a single wavelength and in a single direction and polarization, that is, in a single mode of radiation or in a bundle of close modes.

It has been described in the Background section that several Chebyshev polynomial of the second kind and different degrees and the same argument α are included in the characteristic matrix of a photonic crystal. It is disclosed here that the total reflection band is produced when the argument of the second-kind Chebyshev polynomial is outside the $\alpha=\pm1$ interval. To be more specific, the Chebyshev argument $\alpha$ has, with generality, an asymptote +1 for $\lambda_0\to\infty$ (photon energy 0 eV). When $\lambda_0$ decreases the Chebyshev argument decreases until it reaches the value $\alpha=-1$, so exiting the interval; the trailing edge of the total reflection band is reached. If $\lambda_0$ is further decreased, the Chebyshev argument reaches a minimum and then at a certain value of $\lambda_0$ it reaches again the value $\alpha=-1$, so re-entering the $\alpha=\pm1$ interval, causing the leading edge of the total reflection band. This allows calculating the total reflection band and the position of its leading and trailing edges. If $\lambda_0$ is further decreased the Chebyshev argument describes a wavy curve partially outside the $\alpha=\pm1$ interval and further total reflection bands (photonic bandgaps) are produced but these are not of interest for the present invention.

The position of the leading and trailing edges of the total reflection band of any photonic crystal may be calculated by solving the equation $\alpha_{TE|TM}(\lambda_0, \theta, n_a, n_b, h_a, h_b)+1=0$ if $\theta$, $n_a$, $n_b$, $h_a$, $h_b$ and the polarization are known. The present invention is based on a change of variables which allows the Chebyshev argument to be written in such a way that by selecting a leading edge, or alternatively a trailing edge, of the total reflection band of a photonic crystal, the first ($h_a$) and second ($h_b$) thicknesses of the photonic crystal's unit cell are analytically determined for predefined values of $\theta$, $n_a$, $n_b$.

Also, when the equation $\alpha+1=0$ is solved in the wavelength using the determined first ($h_a$) and second ($h_b$) thicknesses of the photonic crystal's unit cell, the highest root is the trailing edge wavelength value of the total reflection band and the second highest root is the leading edge wavelength value.

What has been said is valid for any incidence angle and polarization and the total reflection bands have different positions and breadths. Considering a single photonic crystal, among the different positions and breadths of the band of this photonic crystal, the leading edge ($\lambda^L$) situated at the lowest wavelength corresponds to the normal incidence. The trailing edge ($\lambda^T$) situated at the highest wavelength corresponds to the TM polarization and highest angle ($\theta_{max}$) of the chosen angular span (preferably levelling incidence, that is, $\theta_{max}=\pi/2$ rad). The total reflection band for any incidence spans from $\lambda^L$ to $\lambda^T$. For $\theta_{max}=\pi/2$ rad, this total reflection band can be called hemispheric or omnidirectional total reflection band. For radiation coming from the outside (from the air), $\lambda^L<\lambda^T$ is always fulfilled and a hemispheric total reflection band exists.

When several photonic crystals are deposited on the same substrate (they are monolithic) the reflectance curves are modified when compared to the reflectance curves of the separated photonic crystals, but the total reflection bands are situated as determined by their Chebyshev arguments, as explained in the present specification. As a matter of fact, the modifications of reflectance affect the regions of $\lambda_0$ where the Chebyshev arguments are within $\alpha=\pm1$ interval and not the total reflection bands. This allows putting the different total reflection bands in desired positions by properly selecting the materials of the layers forming the unit cell of each photonic crystal and by calculating their thicknesses.

A very broad hemispheric total reflection band may be formed by depositing monolithically several photonic crystals on a single substrate.

When a photon, represented by a planewave progresses inside a stack of dielectric layers its angle in the layers j, k, etc. follows the Snell law so that $\sin\theta=n_j\sin\theta_j=n_k\sin\theta_k$ ... (n being the indices of refraction of the layers and $\theta$ the angles inside them). The wavelength inside a layer is $\lambda=\lambda_0/n\cos\theta$ and $h/\lambda$ (h being the thickness of the layer) is the fraction of the internal wavelength. It should be noticed that the wavelength in the layer differs from the wavelength in the vacuum. By choosing the ratio $h_a/h_b$ such that the relation $h_a n_a\cos\theta_a=h_b n_b\cos\theta_b$ is fulfilled, the span of the total reflection band of a certain photonic crystal is maximized (sub indices a and b for the high and low index of refraction layers or vice-versa). In other words, the maximum span occurs when the thickness of the high and low index of refraction layers are the same fraction of their internal wavelengths. This relation imposes a relationship between the thicknesses of the layers of high and low index of refraction. Since this condition can only be fulfilled for a single angle of incidence, the minimum number of photonic crystals in a monolithic array to yield a given span of hemispheric total reflectance occurs when the said condition is fulfilled for the TM polarization levelling rays (this makes the small TM span of individual photonic crystals for levelling incidence the biggest possible).

In an embodiment, the first and second dielectric materials selected to form the unit cell of an i-th photonic crystal are transparent to the radiation in a range of wavelengths which comprises $$\lambda_{0i,i}^L \text{ and } \lambda_{0i,i}^T.$$

Since according to the method of the first inventive aspect the leading edge wavelength value $$\left(\lambda_{0i,i}^L\right)$$

or the trailing edge wavelength value $$\left(\lambda_{0i,i}^T\right)$$

of the total reflection band of each photonic crystal are set, first and second dielectric materials can be selected for the photonic crystal such that they are transparent to radiation with a wavelength in a range comprising the set wavelength value.

In an embodiment $\theta_{max}=\pi/2$.

In an embodiment $\lambda_A$ is comprised in the visible (400-700 nm) or near infrared range (700-2500 nm).

In an embodiment $\lambda_B$ is comprised in the infrared range, preferably in the medium infrared range (2.5-50 μm).

In a preferred embodiment $\lambda_A$ is comprised in the visible or near infrared range and/or $\lambda_B$ is comprised in the medium infrared range.

In an embodiment the first dielectric material and/or the second dielectric material of at least one of the photonic crystals is selected from $MgF_2$, $CaF_2$, ZnS, $TiO_2$, Si and Ge. Preferably, one of the first and second dielectric materials of at least one of the photonic crystals is selected from $MgF_2$, $CaF_2$ and the other of the first and second dielectric materials of said photonic crystal is selected from ZnS, $TiO_2$, Si and Ge.

In a second inventive aspect the invention defines a method of manufacturing a mirror comprising m one-dimensional photonic crystals, with m>1, the method comprising the following steps:

designing the mirror according to the method of any of the embodiments of the first inventive aspect, and forming m stacked one-dimensional photonic crystals, wherein each i-th photonic crystal is formed by stacking a plurality of alternate layers of a first dielectric material and a second dielectric material, the first dielectric material having an index of refraction ($n_{al,i}$, $n_{at,i}$) different to the index of refraction ($n_{bl,i}$, $n_{bt,i}$) of the second dielectric material, and wherein for each i-th photonic crystal the first thickness ($h_{al,i}$, $h_{at,i}$) for every layer of first dielectric material and the second thickness ($h_{bl,i}$, $h_{bt,i}$) for every layer of second dielectric material have the values determined in step (b) of the method of any of the embodiments of the first inventive aspect, with i=1, . . . m.

Such mirror comprising a plurality of stacked photonic crystals is called a monolithic mirror of multiple photonic crystals in the present specification.

In an embodiment the layers of the photonic crystals are deposited on a substrate, either opaque or transparent. In the case of an opaque substrate it might be of high reflectance. The layers of one of the photonic crystals are firstly deposited on the substrate and the subsequent photonic crystals are deposited on previously deposited photonic crystals.

In an embodiment the outermost layer of the mirror is covered with a transparent layer or with a reflective metal (if the substrate is transparent), preferably silver or gold. The outermost layer of the mirror shall be understood as the layer located farthest from the substrate. Advantageously, covering the outermost layer with a reflective metal results in great increase of the reflectance for wavelengths of incident radiation outside the predefined vacuum wavelength range ($[\lambda_A, \lambda_B]$) (i.e. outside the total reflection band of the mirror), whereas for wavelengths of incident radiation within the predefined vacuum wavelength range the reflectance remains without variation. This may have a practical interest in certain applications. Alternatively, the monolithic mirror of multiple photonic crystals may be deposited on a substrate covered with a reflective metal coating (preferably silver or gold) with the same effect and covered or not with a protective thick transparent layer arranged on the outermost layer. In use, when the mirror comprises a reflective metal coating, the mirror is preferably arranged such that the layer oriented to incident radiation is the layer farthest from the reflective metal coating.

In order for the mirror to have maximum reflectance on the predefined vacuum wavelength range, a plurality of one-dimensional photonic crystals with total reflection bands spanning the desired range is stacked to form the mirror.

In an embodiment the photonic crystals are arranged in the mirror in the order defined by the position of their total reflection bands from the lower limit ($\lambda_A$) of the predefined vacuum wavelength range to the upper limit ($\lambda_B$) of the predefined vacuum wavelength range. According to this embodiment, the photonic crystals having their total reflection bands closer to the upper limit ($\lambda_B$) are arranged downstream the photonic crystals having total reflection bands closer to the lower limit ($\lambda_A$) in the direction of incoming radiation in a situation of use of the mirror. In other words, the radiation reaches first the photonic crystals having their total reflection bands closer to the lower limit ($\lambda_A$) and subsequently the photonic crystals having total reflection bands closer to the upper limit ($\lambda_B$). This is applicable to both the embodiment where the photonic crystals are designed from $\lambda_A$ to $\lambda_B$, i.e. setting the leading edge wavelength values, and the embodiment where the photonic crystals are designed from $\lambda_B$ to $\lambda_A$, i.e. setting the trailing edge wavelength values.

In another embodiment the photonic crystals are arranged in the mirror in an order different to the order defined by the position of their total reflection bands from the lower limit ($\lambda_A$) of the predefined vacuum wavelength range to the upper limit ($\lambda_B$) of the predefined vacuum wavelength range. In this embodiment the conditions $$\lambda_2^L = \lambda_1^T, \lambda_3^L = \lambda_2^T, \lambda_4^L = \lambda_3^T, \ldots \lambda_{i+1}^L = \lambda_i^T,$$

are still fulfilled. However, when the photonic crystals are deposited to form the mirror, they are deposited in a different order.

In an embodiment the photonic crystals are arranged in the mirror in an order defined by the transparency of the first and second dielectric materials of the photonic crystals, such that photonic crystals made of a material not transparent to radiation in a wavelength range comprised in the total reflection band of another photonic crystal are placed downstream said another photonic crystal in the direction intended for incoming radiation. In other words, the photonic crystals are arranged such that the materials of the photonic crystals intended to receive first the incoming radiation are transparent to radiation in a wavelength range comprised in the total reflection bands of the photonic crystals arranged to receive the incoming radiation afterwards.

In an embodiment the number of unit cells in each photonic crystal is greater than or equal to 5, preferably greater than or equal to 7, more preferably greater than or equal to 10.

In a third inventive aspect the invention defines a mirror comprising m one-dimensional photonic crystals, with m>1, wherein each photonic crystal comprises a plurality of stacked alternate layers of a first dielectric material and a second dielectric material, the first dielectric material having an index of refraction ($n_{al,i}$, $n_{at,i}$) different to the index of refraction ($n_{bl,i}$, $n_{bt,i}$) of the second dielectric material, with i=1, . . . m, and wherein for each i-th photonic crystal the first thickness ($h_{al,i}$, $h_{at,i}$) at for every layer of first dielectric material and the second thickness ($h_{bl,i}$, $h_{bt,i}$) for every layer of second dielectric material have the values determined in step (b) of the method of any of the embodiments of the first inventive aspect, with i=1, . . . m.

Such mirror according to a third inventive aspect of the invention corresponds with a mirror obtainable by means of the method of the first inventive aspect. Said mirror is recognisable given that, when performing a section of the mounted mirror, electronic microscopy and photography allows differentiating the alternating layers of first and second dielectric materials of each photonic crystal, along with their thicknesses and chemical composition.

Said values, along with the total reflexion area of the manufactured mirror and the areas in which there is no total reflexion allows distinguishing a configuration of a mirror which corresponds to the performance of a method according to the first inventive aspect, and thus such a finished mirror can be characterized by means of its parameters as a mirror designed by means of the mentioned method.

In an embodiment, the mirror according to the third inventive aspect is manufactured using the method according to the second inventive aspect.

The invention further defines a photovoltaic cell comprising a mirror according to the third inventive aspect deposited on a transparent substrate and coated with a metal layer, the photovoltaic cell being a photovoltaic or a thermo-photovoltaic cell.

The invention further defines a photovoltaic cell comprising a mirror according to the third inventive aspect and a semiconductor substrate, the mirror being arranged on the back face of the semiconductor substrate and coated with a metal layer, the photovoltaic cell being a photovoltaic or a thermo-photovoltaic cell. The semiconductor substrate behaves as a transparent substrate for photons of energy below the semiconductor electronic bandgap.

The invention further defines a thermal insulation for an incandescent body, wherein the thermal insulation comprises at least one mirror according to the third inventive aspect. Advantageously, the thermal insulation effectively reflects back the photons received. In an embodiment the thermal insulation comprises at least one photovoltaic cell, at least one thermo-photovoltaic cell, at least one radiant power collection device and/or at least one cooling device.

All the features described in this specification (including the claims, description and drawings) and/or all the steps of the described method can be combined in any combination, with the exception of combinations of such mutually exclusive features and/or steps.

DESCRIPTION OF THE DRAWINGS

These and other characteristics and advantages of the invention will become clearly understood in view of the detailed description of the invention which becomes apparent from a preferred embodiment of the invention, given just as an example and not being limited thereto, with reference to the drawings.

DETAILED DESCRIPTION OF THE INVENTION

Figure 1:
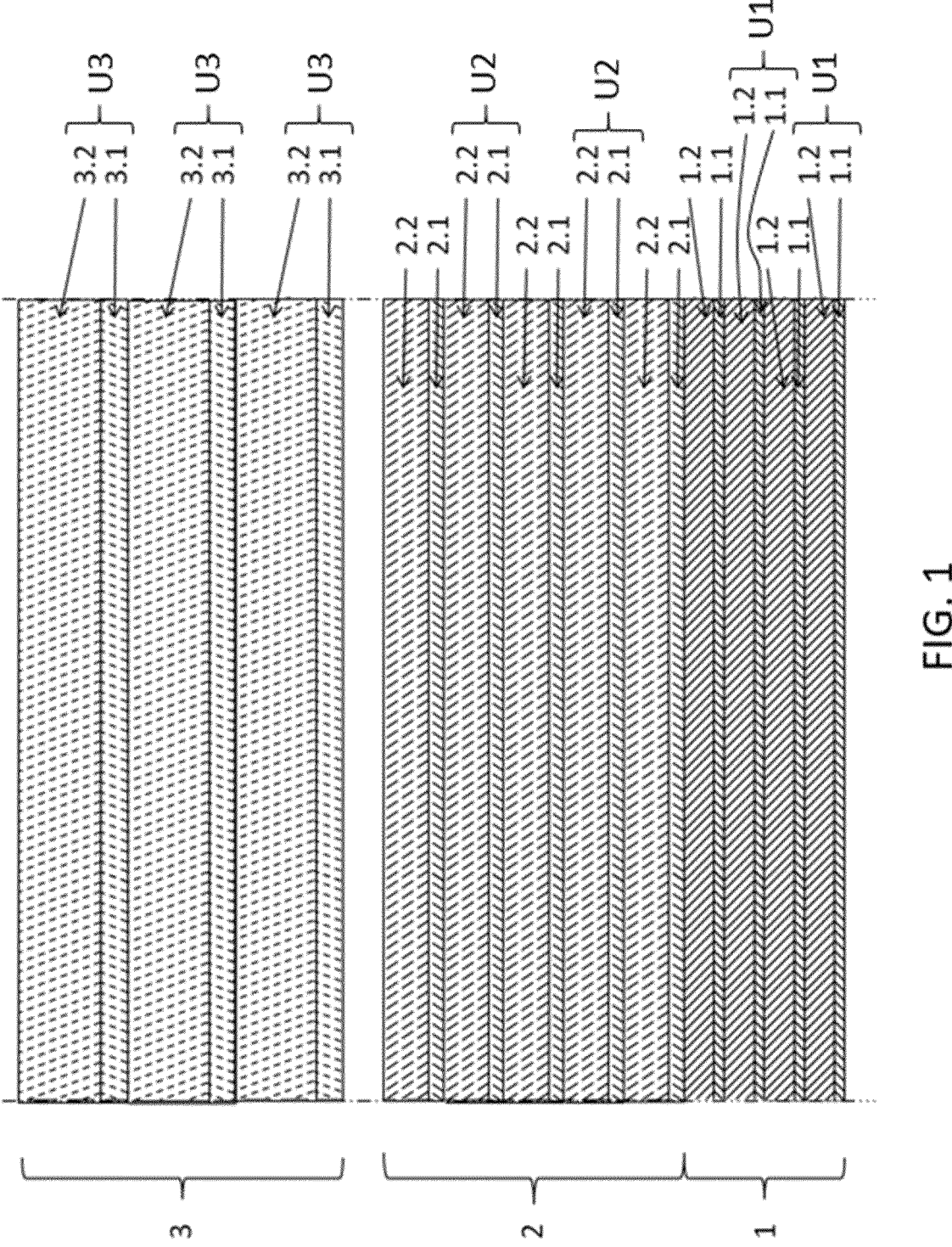
FIG. 1 shows a schematic representation of a monolithic mirror made of multiple photonic crystals, according to an embodiment of the invention.

FIG. 1 shows a schematic representation of a monolithic mirror comprising several one-dimensional photonic crystals (1, 2, 3), according to an embodiment of the invention, wherein all the photonic crystals are deposited on a single substrate (not shown). In this figure, a first (1), a second (2) and a third (3) photonic crystal are shown, but the blank space in the centre of the figure means that more photonic crystals might be present in the mirror. Each photonic crystal contains a plurality of unit cells (U1, U2, U3), each unit cell (U1, U2, U3) containing two dielectric layers (1.1, 1.2; 2.1, 2.2; 3.1, 3.2) of higher and lower indices of refraction and with different thicknesses repeated a number of times. In FIG. 1 only some of the unit cells have been identified. The photonic crystals included in the mirror may have different characteristics, i.e. the dielectrics forming the unit cell of each photonic crystal may be different in each photonic crystal, thus having different index of refraction, and may have different thicknesses, the thicknesses of the layers being defined according to the method of the invention. The mirror thus formed has very high reflectance in a very broad range of wavelengths, in a broad range of directions (even hemispheric) and in different polarizations of the incident photons.

Figure 2:
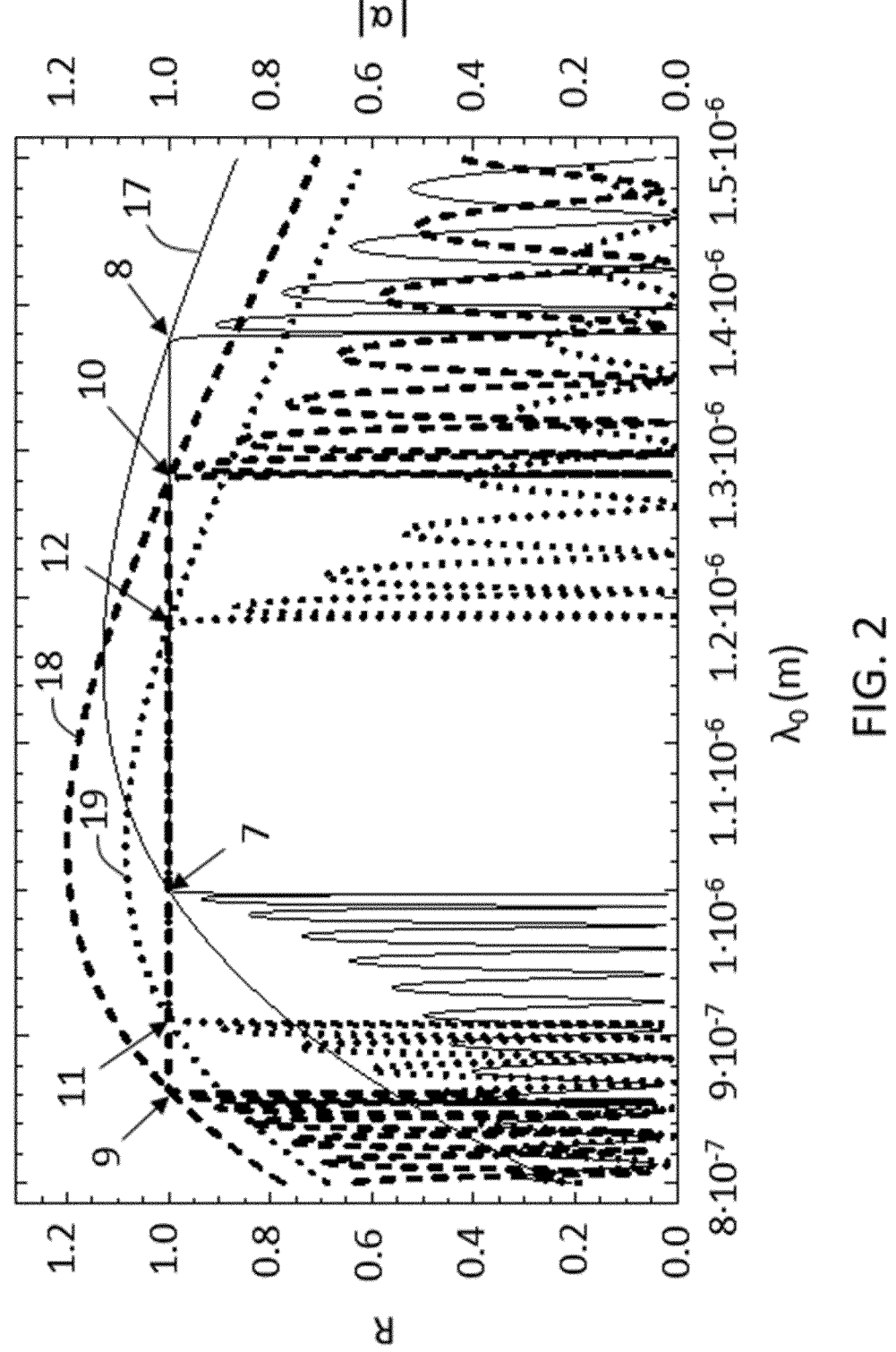
FIG. 2 shows the reflectance of a photonic crystal as a function of vacuum wavelength (in meters) for normal incidence (solid line) of the incident photons, for $\pi/4$ rad incidence and TE polarization (dashed line) and for $\pi/4$ rad incidence and TM polarization (dotted line). Furthermore, the absolute value of the Chebyshev arguments is shown for normal incidence (solid line), for $\pi/4$ rad incidence and TE polarization (dashed line) and for $\pi/4$ rad incidence and TM polarization (dotted line).

FIG. 2 shows the reflectance (R) as a function of vacuum wavelength ($\lambda_0$, in meters) of a one-dimensional photonic crystal. The reflectance (R) has been plotted for normal incidence (solid line) of the incident photons, for $\pi/4$ rad incidence and TE polarization (dashed line) and for $\pi/4$ rad incidence and TM polarization (dotted line). As visible in the figure, the total reflection bands of the photonic crystal extend between points 7 and 8 for photons of normal incidence, between points 9 and 10 for TE photons of $\pi/4$ incidence and between points 11 and 12 for TM photons of $\pi/4$ incidence. It can be appreciated in FIG. 2 how the total reflection bands are shifted for different incidence angles and polarizations.

The forbidden band or bandgap of a photonic crystal occurs when the argument $\alpha$ of the second-kind Chebyshev polynomials of the characteristic matrix of the photonic crystal exits the $-1<\alpha<+1$ range. The absolute value of the Chebyshev arguments is represented for the photonic crystal in FIG. 2 for normal incidence (solid line, denoted as "17" in the figure), for $\pi/4$ rad incidence and TE polarization (dashed line, denoted as "18" in the figure) and for $\pi/4$ rad incidence and TM polarization (dotted line denoted as "19" in the figure).

It is seen that the total reflection bands appear when the absolute value of the Chebyshev argument exceeds the value 1. The edges of the total reflection bands are the abscissas of the ends of the segment extending from point 7 to point 8 for normal incidence, of the segment extending from point 9 to point 10 for $\pi/4$ rad incidence and TE polarization and of the segment extending from point 11 to point 12 for $\pi/4$ rad incidence and TM polarization. According to the present invention, the wavelengths corresponding to the edges of the total reflection bands are calculated with an analysis of the Chebyshev argument, which can be totally analytical. This is much faster and simpler than calculating the reflectance curves.

It is clear from FIG. 2 that for a given 1D photonic crystal the total reflection bands vary in position and in width with the photon incidence angle and with its polarization. It can also be observed that in the band extending from point 7 to point 12, total reflection is produced for any incidence angle up to $\pi/4$ rad and for any polarization. The same result would occur for a maximum incidence angle of $\pi/2$ rad (levelling incidence), although in such case the band of hemispherical total reflection results narrower. Outside the total reflection bands represented by the segments above, the reflectance curves show a wavy behaviour, as already stated in this specification.

The photonic crystal represented in FIG. 2 contains 30 unit cells formed of a couple of dielectric layers of zinc sulphide, having an index of refraction of 2.3 and a thickness of 98 nanometers (nm) and magnesium fluoride, having an index of refraction of 1.35 and a thickness of 261 nm. All the layers are deposited on a glass substrate of index of refraction 1.52. This material of the substrate does not affect the forbidden bands (bandgaps) but it affects the reflections produced outside them. A slight rounding is produced at the corners of the total reflection bands. It is due to the finite number of layers in the photonic crystal (60 in this case). This rounding increases if the number of layers is reduced.

The present method is based on the study of the Chebyshev argument. For a given angle of incidence ($\theta$) of the radiation, the reflectance is wavy and below one when $|\alpha_{TE|TM}| < 1$ and is one (total reflectance) when $|\alpha_{TE|TM}| > 1$. The edges of the total reflection band, for a given angle of incidence, happen when $|\alpha_{TE|TM}| = 1$. For maximum angle of incidence ($\theta_{max}$), including $\theta_{max} = \pi/2$, which corresponds to hemispheric radiation, the leading edge corresponds to normal radiation and the trailing edge corresponds to TM polarized $\theta_{max}$ incidence (leveling for hemispheric radiation).

The present invention proposes the use of a plurality of photonic crystals which add their individual total reflection bands for the prescribed angular span (possibly hemispheric) until the desired wavelengths span is covered.

The present invention is based on a change of variables which allows the Chebyshev argument to be written in such a way that by selecting a leading edge, or alternatively a trailing edge, of the total reflection band of a photonic crystal, the first ($h_a$) and second ($h_b$) thicknesses of the photonic crystal's unit cell can be analytically determined. The other edge of the total reflection band inherent to each 1D-photonic crystal is obtained based on the calculated thicknesses.

Advantageously, the present method provides extremely high efficiency mirrors, with calculated efficiencies of up to 0.999999, with a broad span of the total reflectance band, for example from 1.77 to 20 $\mu$m.

On the contrary, a configuration based on multilayer filters used in monochromatic mirrors (like the Carniglia's reference cited in the Background section), does not allow a total reflection band comprising tens of micrometers, thus including wavelengths from the visible to the mid infrared, nor does it provide the leading and trailing edges of the photonic crystal.

Albeit reference has been made herein to hemispheric or omnidirectional reflectance, the present invention can also be applied to cases where the total reflectance is assured within a maximum angle of incidence $\theta_{max} < \pi/2$.

To this end, the expression of the Chebyshev argument, $\alpha_{TE|TM}(\lambda_0, \theta, n_a, n_b, h_a, h_b)$, after some mathematical handling from the expression in the cited book of Born and Wolf, may be written as $$\alpha_{TE|TM} = \cos\left[\frac{2\pi(n_a h_a \cos\theta_a + n_b h_b \cos\theta_b)}{\lambda_0}\right]\frac{(p_a + p_b)^2}{4p_a p_b} \quad (1)$$

$$-\cos\left[\frac{2\pi(n_a h_a \cos\theta_a - n_b h_b \cos\theta_b)}{\lambda_0}\right]\frac{(p_a - p_b)^2}{4p_a p_b}$$

$$\text{with (for non magnetic materials)} \begin{cases} TE: p_{a,b} = n_{a,b}\cos(\theta_{a,b}) \\ TM: p_{a,b} = \cos(\theta_{a,b})/n_{a,b} \end{cases}$$

following the Snell law, $\theta_a = \arcsin(\theta)/n_a$, $\theta_b = \arcsin(\theta)/n_b$ with $\theta$ being the angle of incidence with respect to axis z in the air and $\theta_a$, $\theta_b$ being the angles of the photons (or planewave wavevectors) inside the layers of thickness $h_a$, $h_b$.

By making the following change of variables $$\frac{\pi X}{2} = \frac{2\pi(n_a h_a \cos\theta_a + n_b h_b \cos\theta_b)}{\lambda_0} \quad (2)$$

$$\frac{\pi Y}{2} = \frac{2\pi(n_a h_a \cos\theta_a - n_b h_b \cos\theta_b)}{\lambda_0}$$

$$Z_{TE|TM} = \begin{cases} n_a\cos(\theta_a)/(n_b\cos(\theta_b)) & \text{for } TE \\ n_b\cos(\theta_a)/(n_a\cos(\theta_b)) & \text{for } TM \end{cases}$$

$\alpha_{TE|TM}$ can be written as:

$$\alpha_{TE|TM} = \cos(\pi X/2)\frac{(1 + Z_{TE|TM})^2}{4Z_{TE|TM}} - \cos(\pi Y/2)\frac{(1 - Z_{TE|TM})^2}{4Z_{TE|TM}} \quad (3)$$

Figure 3:
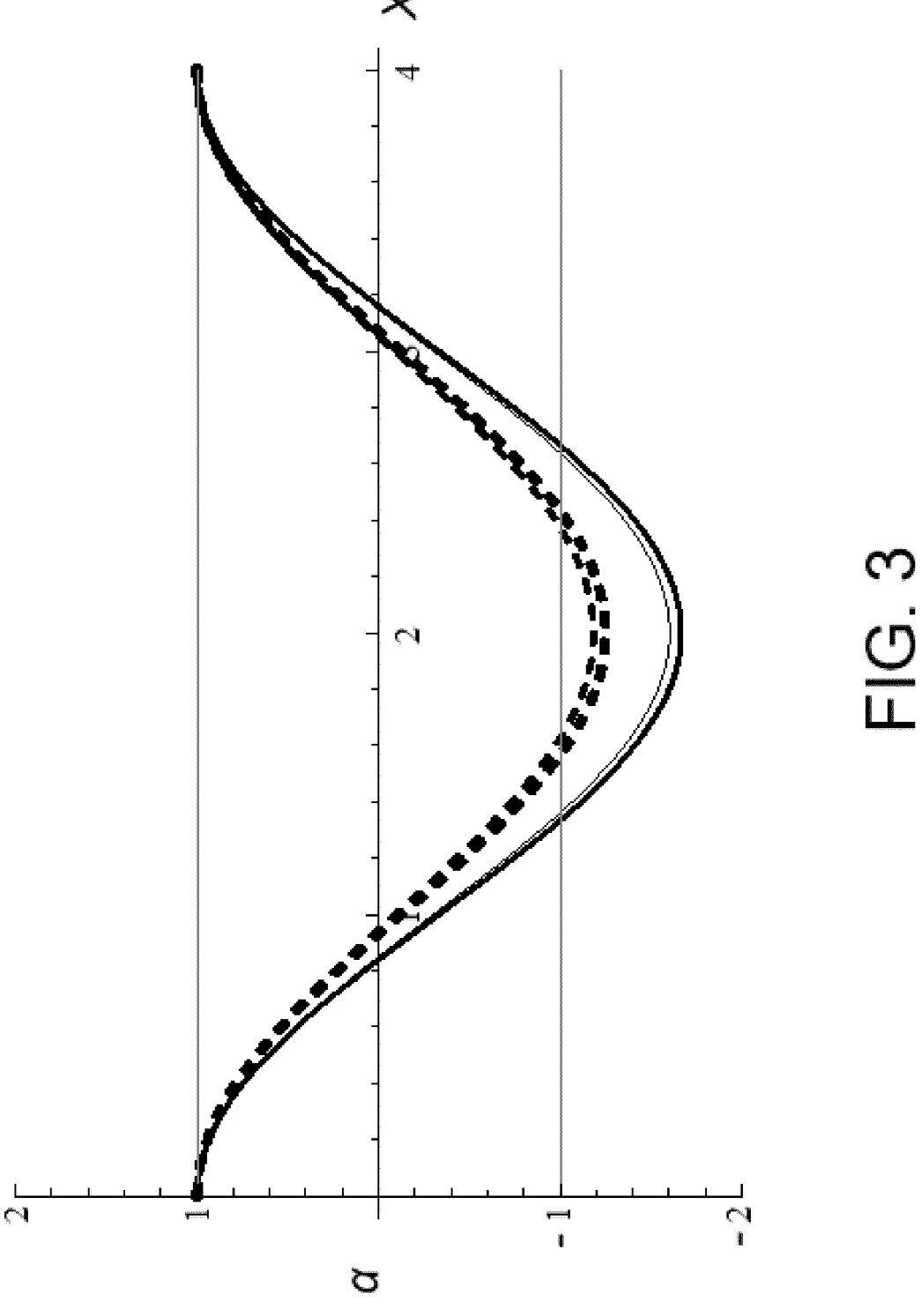
FIG. 3 shows $\alpha$ vs. X for Y=0, for Z=3 (solid thick line), for Z=2 (dashed thick line), for Z=0.35 (solid thin line), and for Z=0.55 (dashed thin line).
Figure 4:
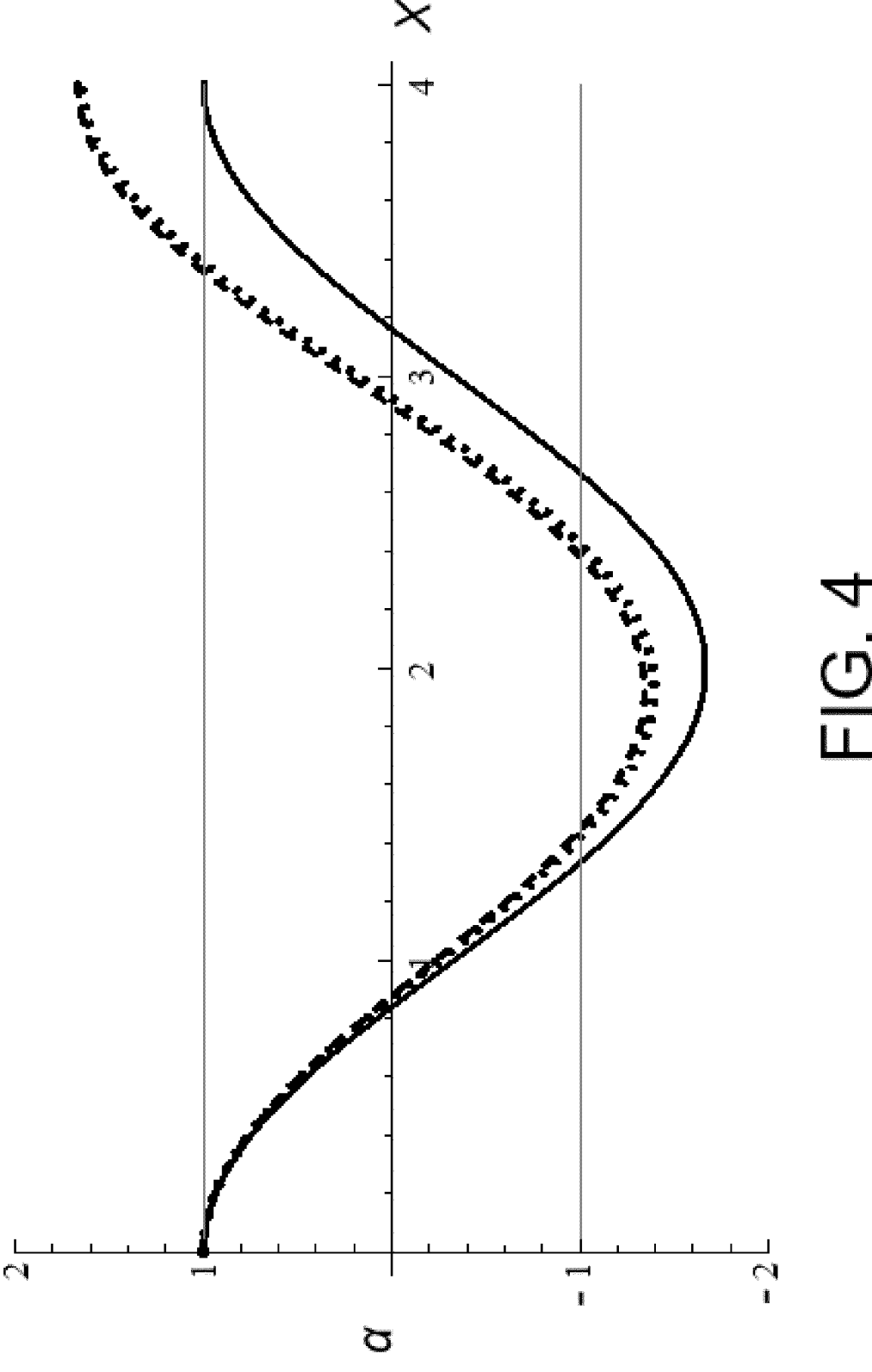
FIG. 4 shows $\alpha$ vs. X for Z=3, for Y=0 (solid line), for Y=0.5X (dashed line), and for X=−0.45Y (dotted line).

This change of variables provides big insight on the Chebyshev argument properties. Notice that the $\alpha_{TE|TM}$ (X, Y, $Z_{TE|TM}$) function varies for different radiation incidence angles. In FIGS. 3 and 4 two plots of $\alpha_{TE|TM}$ (x, Y, $Z_{TE|TM}$) vs. X are presented.

The plots in FIG. 3 correspond to cases where Y=0. When this happens $\alpha_{TE|TM}$ (X, Y, $Z_{TE|TM}$) is periodic on variable X with period 4. In FIG. 3 the case for Z=3 is plotted in thick continuous line, and the case for Z=0.35 (almost the inverse of 3) is plotted in thin continuous line. This is to stress that a value of Z and its inverse give the same curve. The cases of Z=2 and Z=0.55 (almost $\frac{1}{2}$) are plotted in thick and thin dotted lines. The total reflection band takes place when $\alpha$ is below the $-1$ gray line. If Z>1 it is broader when Z is larger. If Z<1 the total reflection band is broader when 1/Z is larger. In cases where Y=0 equality of the fractions of wavelengths in the high and low index of refraction layers is achieved.

In FIG. 4 it is shown the case of Z=3 and three values of Y. Y=0 (thick solid line) repeats one of the curves in FIG. 3. This case is the one with the largest total reflection band span. For the other cases shown in the figure, namely for Y=0.5 (dashed line) and Y=−0.45 (dotted line), the curves are almost the same. This is to stress that opposite values of Y give the same $\alpha$. When Y≠0, a is not periodic anymore. Here the fraction of wavelength in the high and low index of refraction layers differs.

Many of the graphics in the present document are represented as a function of $\lambda_0$. X and Y are inversely proportional to $\lambda_0$ although their ratio $Y/X = r_{TE|TM}$ is independent of it, as it is also Z. This ratio is $$r_{TE|TM} = \begin{cases} \dfrac{(Z_{TE}h_a/h_b) - 1}{\dfrac{Z_{TE}h_a}{h_b} + 1} & \text{for } TE \\[3em] \dfrac{\cos^2(\theta_a) - ((Z_{TM}h_b/h_a)\cos^2(\theta_b))}{\cos^2(\theta_a) + \left(\left(\dfrac{Z_{TM}h_b}{h_a}\right)\cos^2(\theta_b)\right)} & \text{for } TM \end{cases} \quad (4)$$

Furthermore, the first photonic bandgap which is the nearest to X=Y=0, occurring for $\lambda_0 \to \infty$ is the most interesting one. This band (as visible in FIG. 3) is produced when $\alpha_{TE|TM} = -1$ and therefore the two first roots (respectively corresponding to the training and leading edges of the first total reflection band) that embrace the first photonic bandgap are the ones of interest.

Among the properties that can be extracted from the present analysis, it is found that the first photonic bandgap is largest when Y=0, that is, when the fraction of wavelength inside the high and low index of refraction materials is the same. The traditional use of the wavequarter, so much used in monochromatic optics, fulfils this condition. It is also found that the bandgap is larger when the ratio $n_a/n_b$ or $n_b/n_a$ is greater.

For Y=0, Equation (3) becomes a periodic function (with period 4 in X) ruled by $\cos(\pi X/2)$ and the solution of $\alpha_{TE/TM} + 1 = 0$ is analytic. According to this, if a certain trailing edge wavelength $$\lambda_0^T$$

is selected, the following expressions are obtained:

$$h_{at} = \frac{\lambda_0^T}{4\pi n_a \cos\theta_a}\left\{\arccos\left[\frac{(1-Z)^2 - 4Z}{(1+Z)^2}\right]\right\} \quad (5)$$

$$h_{bt} = h_{at}n_a\mathrm{Cos}(\theta_a)/(n_b\mathrm{Cos}(\theta_b))$$

wherein the subindex of Z has been dropped to mean that the equations are valid for both polarizations. If a certain leading edge is selected the equations are as follows:

$$h_{al} = \frac{\lambda_0^L}{4\pi n_a \cos\theta_a}\left\{2\pi - \arccos\left[\frac{(1-Z)^2 - 4Z}{(1+Z)^2}\right]\right\} \quad (6)$$

$$h_{bl} = h_{al}n_a\mathrm{Cos}(\theta_a)/(n_b\mathrm{Cos}(\theta_b))$$

The arccos function has an infinity of solutions $\{\gamma, 2\pi-\gamma, 2\pi+\gamma, 4\pi-\gamma, 4\pi+\gamma \ldots \}$. The solution $\gamma$ corresponds to the trailing edge of the total reflection band and the solution $2\pi-\gamma$ corresponds to the leading edge of the total reflection band.

Once the thicknesses of the layers of the unit cell have been determined, either by setting the trailing edge wavelength or the leading edge wavelength, the photonic crystal is fully and uniquely defined, in default of the number N of unit cells forming the crystal, which as said above is not included in the Chebyshev argument. The more unit cells, the more squared is the total reflection band of the photonic crystal.

According to the present method, the unknown band edge, opposite to the band edge set at the beginning of the method, is obtained. For said purpose, Equation (1) is used and a $\lambda_0$ root of $\alpha+1=0$ is obtained by numeric iterative resolution. There are several roots so that the initial $\lambda_0$ set to start the iterations will determine the root found.

For it normalized Equation (3) is used to solve $\alpha(X, rX, Z)+1=0$ in X by numeric iterative resolution, starting with initial value 1 to obtain a trailing edge and with initial value 3 to find a leading edge. Being unnecessary, subindices have been dropped out. These initial values are found from inspection of FIG. 3. Once X has been extracted, the use of Equations (2) allows to write $$\lambda_{0,trail} = \frac{8n_a h_{al}\cos(\theta_a)}{X+Y} = \frac{8n_a h_{al}\cos(\theta_a)}{X(1+r_{TM})} \quad (7)$$

Concerning $\theta_a$ and $\theta_b$ (also present in $r_{TM}$), they can be 0 for a leading edge and their values may be derived from the Snell law relations starting with a vacuum (or air) angle of incidence $\theta_{max}$, that for hemispheric illumination is $\pi/2$: $\theta_a = \mathrm{ArcSin}(\theta)/n_a$, $\theta_b = \mathrm{ArcSin}(\theta)/n_b$.

Concerning the indexes of refraction $n_a$ and $n_b$, their values are defined by the material used and to a lesser extent, by the way of preparation of the material. In an embodiment the materials used for the layers of the unit cell are insulators, transparent to light. $MgF_2$ or $CaF_2$, having indexes of refraction 1.37397 and 1.4328 and electronic bandgaps of 12.2 and 10 eV, respectively, are preferred for the low index of refraction layers. ZnS, CdS and $TiO_2$, having indexes of refraction 2.3677, 2.614 and 2.609 and electronic bandgaps of 2.54, 2.42 and 3.05 eV, respectively, are preferred for the high index of refraction layers. However, other materials, including polymers and organic materials, may be used.

In an embodiment, when arranging the photonic crystals in the mirror, layers of materials with small electronic bandgap are not located in the path of the radiation in order to avoid absorption of the photons before they reach the depth where they must suffer interference. For instance the vacuum wavelength corresponding to the CdS is, $\lambda_0 = hc/2.42e = 5.12 \times 10^{-7}$ m, that renders this material not transparent below 512 nm, therefore opaque to the blue and UV radiation. For medium IR radiation the use of semiconductors is preferred. Si and Ge, with indices of refraction 3.42 and 4.04, are ideal as high index of refraction layers beyond $\lambda_0(Si) = hc/1.12e = 1.107 \times 10^{-6}$ m and $\lambda_0(Ge) = hc/0.67e = 1.85051 \times 10^{-6}$ m, since Si and Ge are not transparent to radiation in the visible range.

Thus, photonic crystals containing these semiconductors are preferably located in the mirror downstream photonic crystals having higher electronic bandgap dielectrics such that the high energy photons have been already reflected by said photonic crystals when the incoming radiation reaches the semiconductors.

For manufacturing the layers of the photonic crystals there is a bunch of possible technologies. Sputtering technology is interesting for price and reliability, but other techniques like MBE (molecular beam epitaxy) or MOVPE (metal organic vapor phase epitaxy) may be of high interest to explore high index of refraction layers.

Figure 5:
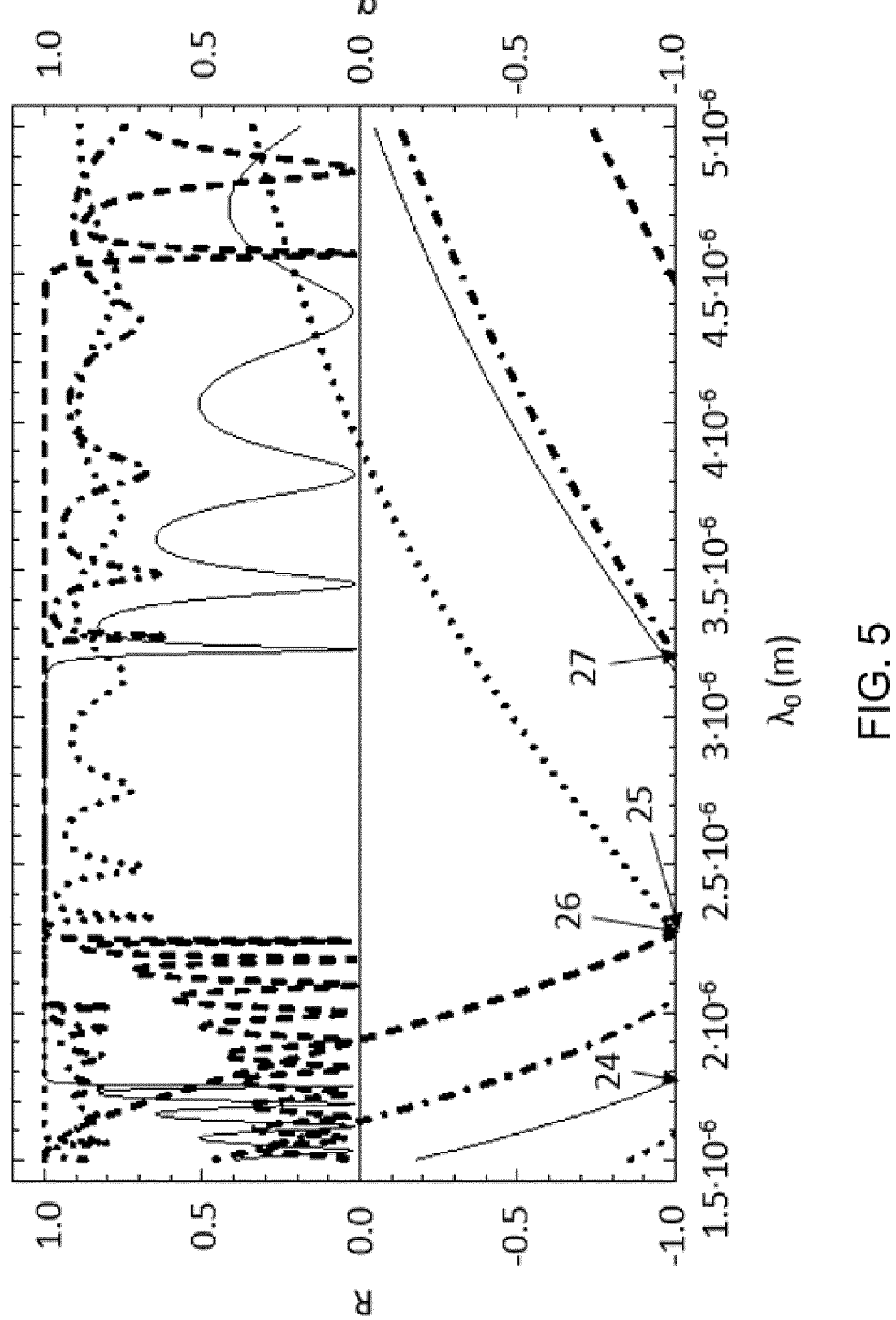
FIG. 5 shows reflectance curves (in the plot upper part) and Chebyshev arguments (mainly in the plot lower part), as a function of the vacuum wavelength (in meters) of the incident photons for two photonic crystals and for different incidence angles.

FIG. 5 shows reflectance curves (in the upper part of the graph) and Chebyshev arguments (mainly in the lower part of the graph), as a function of the vacuum wavelength (in meters) of the incident photons for two photonic crystals. For both photonic crystals two cases are represented: under normal incidence ($\theta=0$), and under levelling incidence ($\theta=\pi/2$ rad) and TM polarization; the solid lines represent the reflectance (R) and the Chebyshev argument (α) for the first photonic crystal under normal incidence (θ=0); the dotted lines represent the reflectance (R) and the Chebyshev argument (α) for the first photonic crystal under levelling incidence (θ=π/2 rad for the Chebyshev argument and θ=0.99×π/2 rad for the reflectance) and TM polarization. The dashed lines represent the reflectance (R) and the Chebyshev argument (α) for the second photonic crystal under normal incidence (θ=0). The dot-dashed lines represent the reflectance (R) and the Chebyshev argument (α) for the second photonic crystal under levelling incidence (θ=π/2 rad for the Chebyshev argument and θ=0.99×π/2 rad for the reflectance) and TM polarization. For the reflectance almost levelling (θ=0.99×π/2 rad) incidence has been used. The reason of using "almost" levelling rays in the reflectance is to avoid the presence of false total reflection bands formed by rays that do not actually enter the photonic crystals. This is not necessary in the Chebyshev arguments, for which levelling incidence (θ=π/2 rad) has been used.

For the first photonic crystal a hemispheric total reflection band is formed between the point 24 (solid line) of diving of the Chebyshev argument of the first photonic crystal for normal incidence into the frame edge situated at α=−1, which defines its leading edge, and the point 25 (dotted line) of emergence into said frame of the Chebyshev argument of the first photonic crystal for levelling incidence and TM polarization, which defines its trailing edge; this is the hemispheric total reflection band (spanning from point 24 to point of the first photonic crystal, as explained in the discussion of FIG. 2. For the second photonic crystal a hemispheric total reflection band is formed between the point 26 (dashed line) of diving of the Chebyshev argument of the second photonic crystal for normal incidence, which defines its leading edge, and the point 27 (dot-dashed line) of emerging of the Chebyshev argument of the second photonic crystal for levelling incidence and TM polarization, which defines its trailing edge; this is the hemispheric total reflection band (spanning from point 26 to point 27) of the second photonic crystal.

The fact that the trailing edge wavelength value (25) of the first photonic crystal and the leading edge wavelength value (26) of the second photonic crystal coincide makes the two photonic crystals fit, if the two photonic crystals are deposited on the same substrate, forming a wider hemispheric total reflection band spanning from point 24 to point 27. The reflectance of the mirror comprising the two photonic crystals is not drawn in the figure and is squarer than those presented for the separated photonic crystals.

Figure 6:
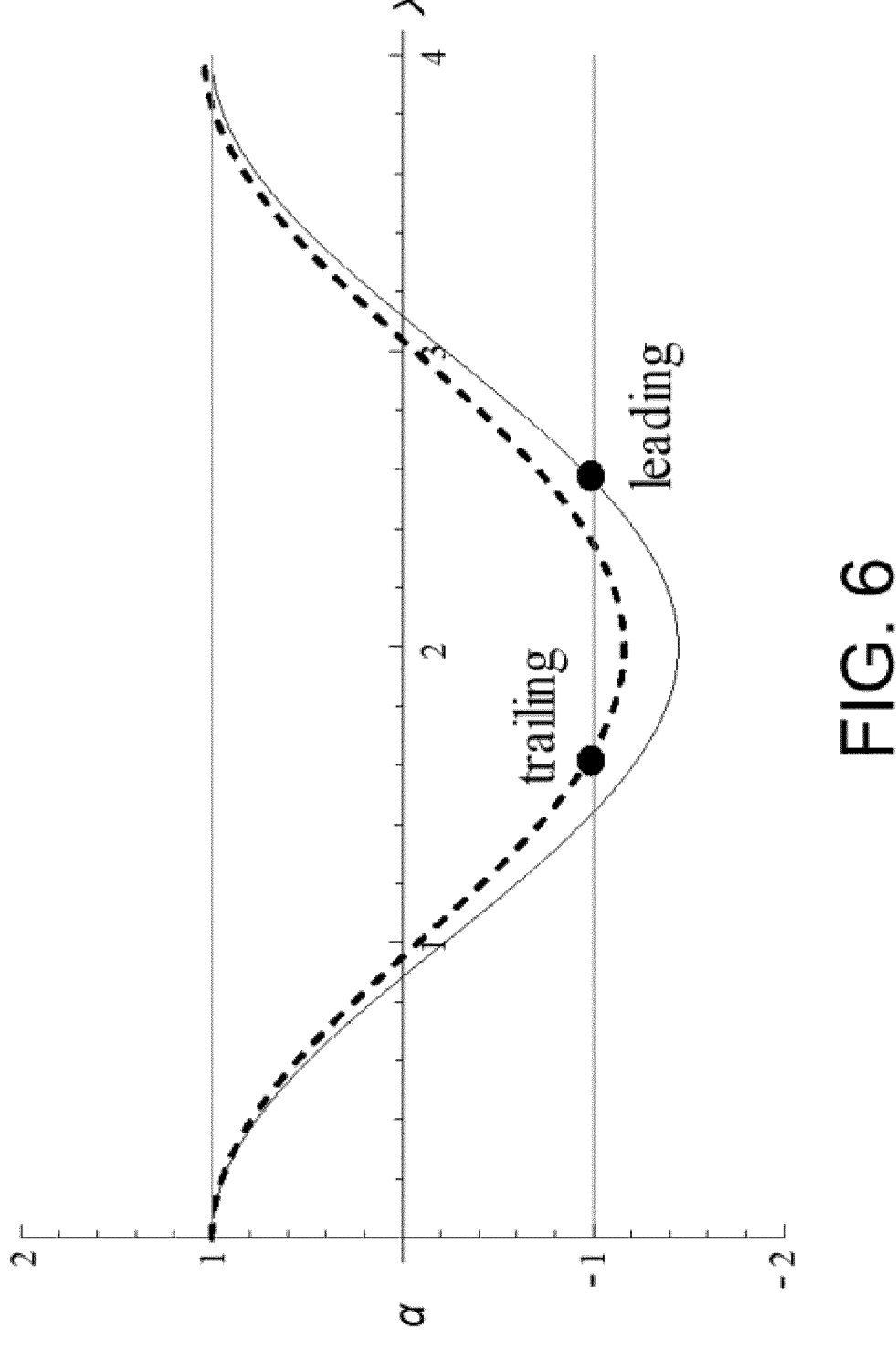
FIG. 6 shows $\alpha$ vs. X for the first photonic crystal of FIG. 5. Solid line for normal incidence with Y=0; dashed line for Y≠0. The X values of the leading and trailing edge of the hemispheric total reflection band are marked in the plot.

Once the leading edge (24) of the first photonic crystal for normal incidence is known, the thicknesses of the two layers of the unit cell are calculated using equation (6) particularized for normal incidence (also labelled "leading" in FIG. 6 of X abscissas). The trailing edge wavelength of the levelling radiation and TM polarization, is then calculated yielding the trailing edge of the hemispheric total reflection band of the first photonic crystal. As already explained, it is obtained by solving in X the equation α(X,rX,Z)+1=0 starting in X=1 for levelling incidence and TM polarization. Once X is obtained, the trailing edge wavelength (25) is calculated with equation (7), again for levelling incidence and TM polarization (labelled trailing in FIG. 6). FIG. 6 shows a plot of the functions α(X,rX,Z) X for normal incidence (solid line) and for levelling incidence and TM polarization (dashed line in FIG. 6). As shown, the dashed curve is slightly non-periodic, meaning that for it Y≠0. In the figure, the values of X for leading and training band edges are marked with thick dots.

For the second photonic crystal the trailing edge of the first photonic crystal obtained above becomes the leading edge (26), so leading to a perfect fitting of the two total reflection bands. The calculation method described for the first photonic crystal is repeated for the second photonic crystal. For a mirror comprising more than two photonic crystals, this process is to be repeated every two photonic crystals, until the trailing edge of the last photonic crystal equals or exceeds the highest vacuum wavelength at which the hemispheric total reflection band is desired to extend (λ_B), that is, at the emergence point of the Chebyshev argument for levelling (θ_{max}=π/2 rad) incidence and TM polarization of the last photonic crystal. As for the initial wavelength of the hemispheric total reflection band of the mirror, it is situated at the leading edge of hemispheric total reflection band of the first photonic crystal (λ_A), that is, at the diving point of the Chebyshev argument for normal incidence of the first photonic crystal.

In the example of FIG. 5 the high and low refraction indices for the firstly deposited photonic crystal are 3.43 (silicon) and 1.37 (magnesium fluoride) and the layer thicknesses are 166 and 413 nm, respectively. For the secondly deposited photonic crystal the refraction indices are 4.04 (germanium) and 1.37 (magnesium fluoride) and the layer thicknesses are 186 and 557 nm, respectively. The two photonic crystals are deposited in two separate glass substrates of index of refraction 1.52 and without any front protection (air). The leading edge (24) of the total reflection band of the mirror which includes the monolithic combination of the first and second photonic crystal is 1.77 μm, corresponding to the electronic bandgap of a 0.7 eV photovoltaic cell; the obtained trailing edge (27) of the total reflection band of the mirror is 3.32 μm. For a mirror including more than two photonic crystals conveniently fitted, the trailing edge would be much higher.

It can be appreciated in FIG. 5 that the total reflection bands at different incidence angles and polarizations extend well beyond the total reflection band for hemispheric total reflection, which extends from point 24 to point 27. This means that there is redundancy in the sense that many photons find more than one photonic crystal able to reflect them. The same happens with the levelling photons with TE polarization, whose reflectance in not drawn but forms a broader total reflection band and, in general, the same happens for all the photons. This explains the good results obtained even using very thin photonic crystals, having few unit cells. The results in FIG. 5 correspond to 10 unit cells per photonic crystal but only 7 unit cells often give good results and this number might be reduced.

Figure 7:
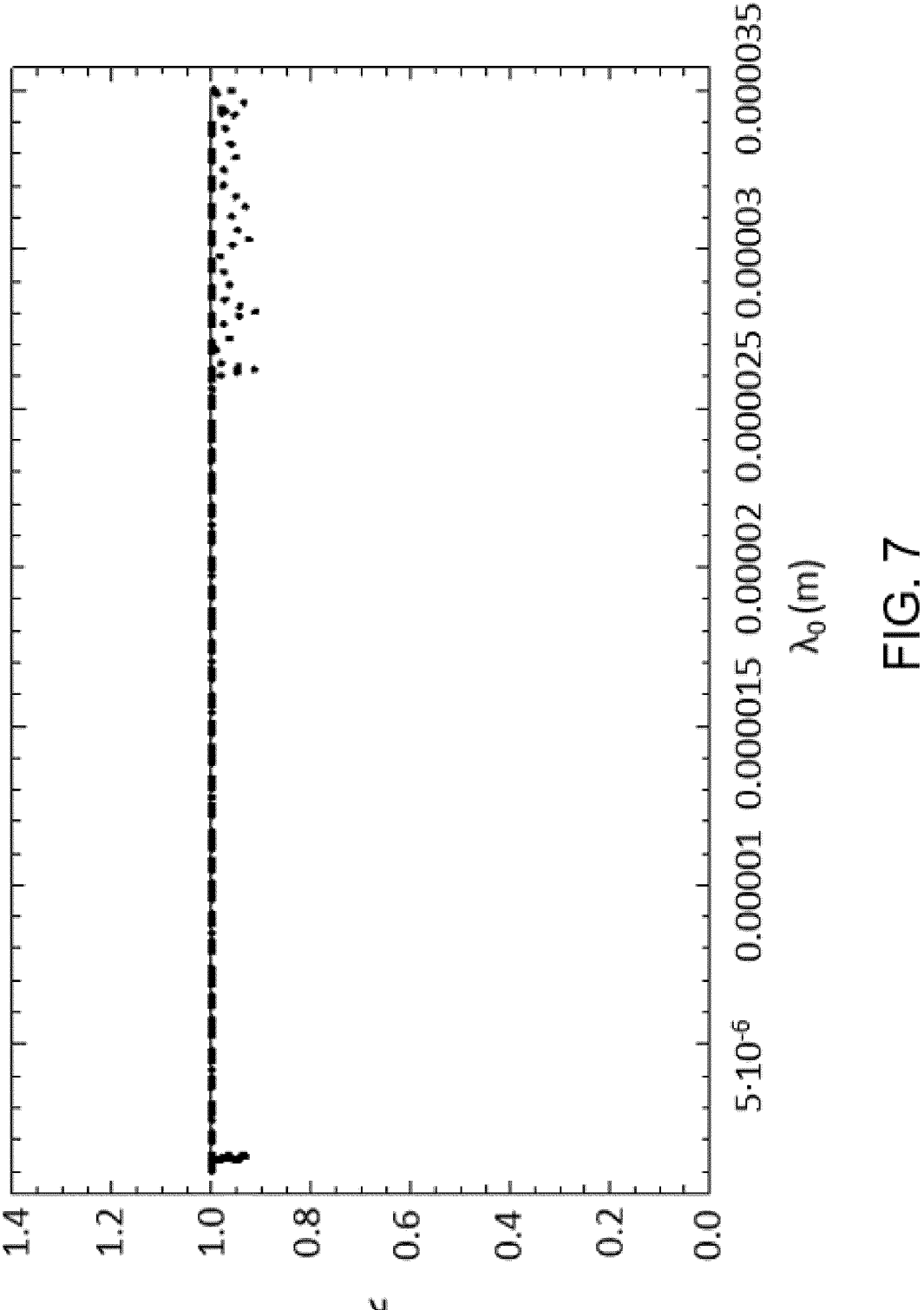
FIG. 7 shows the reflectance curves of a monolithic mirror made of multiple photonic crystals as a function of the vacuum wavelength (in meters) for different incidence angles.

FIG. 7 shows the reflectance (R) curves of a monolithic mirror made of multiple photonic crystals as a function of the vacuum wavelength in meters. The monolithic mirror is intended to reflect the radiation received hemispherically in the range of 1.77 to 20 μm. In this embodiment the mirror is formed of a monolithic stack of 8 photonic crystals, each photonic crystal having 10 unit cells and, everything, monolithically deposited on the back face of a photovoltaic cell of 0.7 eV of electronic bandgap (close to that of germanium) and covered with a thick silver layer. In total, the stack has 160 layers of different dielectrics.

Figure 8:
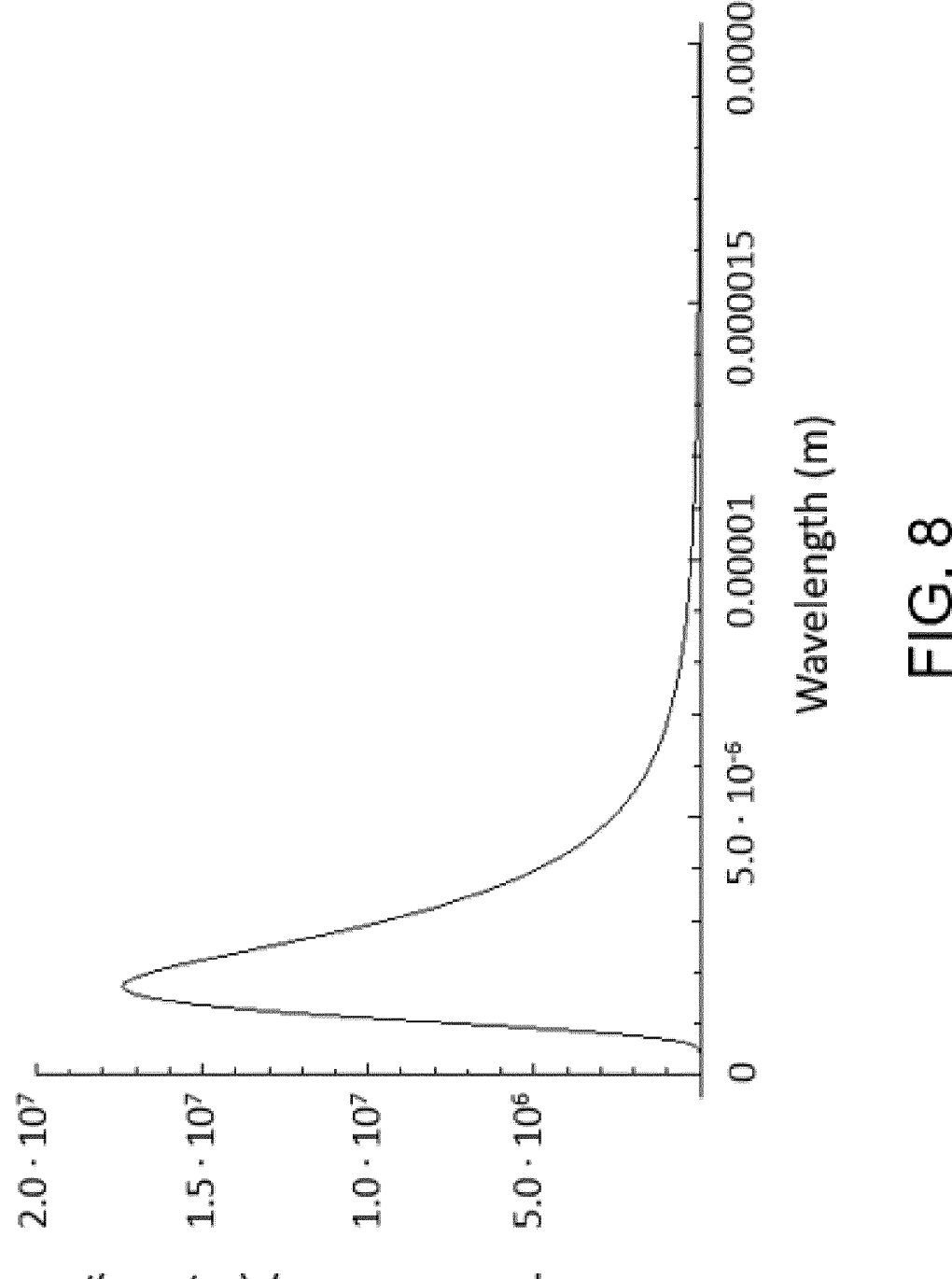
FIG. 8 shows the spectral power in W/cm$^2$ per meter of the blackbody at 1410° C. vs. the vacuum wavelength is in meters.

In this figure the solid line is the reflectance under normal incidence, whereas the dashed and dotted lines are the reflectance curves under θ=0.99×π/2 rad and TE and TM polarizations, respectively. The average reflectance under the radiation spectrum emitted by a blackbody at 1410° C. (the melting point of the metallurgical silicon), whose emission spectrum is presented in FIG. 8, in the range 1.77-20

μm, unpolarized (as many TE as TM photons) and averaged by the energy spectrum, on all the angles of hemispheric incidence is 0.999999. Thus, a hemispheric total reflection band having a width of 18.24 μm is achieved in this example with the averaged given energetic efficiency. It should be remarked that the best result obtained with the theoretical magnetic materials and the genetic algorithm of Qiang, H., Jiang, L., Li, X.: "*Design of broad omnidirectional total reflectors based on one-dimensional dielectric and magnetic Photonic Crystals*", Optics and Laser Technology 42(1), 105-109 (2010), doi:10.1016/j.optlastec.2009.05.006 leads to a hemispheric total reflection band of 6.80 μm, in contrast with the 18.24 μm achieved in the example of FIG. 7 and no data of efficiency are given.

In this embodiment the high index of refraction material of the photonic crystals is zinc sulphide, silicon or germanium (depending on the specific photonic crystal) and the low reflection index material is magnesium fluoride, their thicknesses being different in each photonic crystal. The layers described in connection with the embodiment of FIG. 5 are a part of this mirror. As already said, the use of almost levelling incidence ($\theta = 0.99 \times \pi/2$ rad) is to avoid the apparent total reflection of photons not entering the mirror.

This invention also defines a thermal insulation for an incandescent body, wherein the thermal insulation comprises at least one mirror according to the invention. Preferably, the thermal insulation comprises a plurality of mirrors according to the invention. The incandescent body may be part of a furnace or of a system for energy storage, among others.

In the embodiment above a very good quality mirror has been designed according to the method of the invention by iterations from low to high wavelengths. With the present invention it is equally possible to design a similar structure starting with the high wavelengths and then iterate towards the shorter wavelengths. By knowing the trailing edge wavelength, equation (5) is readily used to obtain the thicknesses of the layers of the unit cell for levelling incidence and the successive leading edges are calculated with the solution in X of $\alpha(X, rX, Z) + 1 = 0$ starting with X=3, and converting it into wavelength with equation (7).

A possible application of the present invention is the lining of a furnace for storing energy in molten silicon at 1410° C. The silicon is kept in a vessel heated by resistors, microwaves or by other means. This energy is eventually extracted as electrical power by means of thermo-photovoltaics.

In an embodiment of the present invention, the thermal insulation of the incandescent vessel is a wrapper comprising a plurality of monolithic mirrors of multiple photonic crystals. These mirrors reflect the photons emitted by the incandescent vessel with a very high efficiency. The averaged reflectance for a blackbody at 1410° C. between 0.6 and 35 μm (outside this range the power is negligible) for unpolarized radiation in all hemispheric directions is 0.9998, constituting an exceptionally good thermal insulator. Indeed, the connection to the resistors heating the vessel and some pivots necessary for keeping the vessel in place leak heat, but they should be reduced to the strictly necessary to insure the electricity input and the mechanical stability.

In a preferred embodiment a mirror for thermal insulation of an incandescent body as described above contains 15 photonic crystals of 7 unit cells each, which are deposited monolithically on a metal covered with a thick layer of silver or gold. Several materials are used for the high index of refraction layers: zinc sulphide (2.614), silicon (3.42) and germanium (4.04). For the low index of refraction layers magnesium fluoride (1.374) is used in every photonic crystal. The mirror contains in total 210 layers. The mirror has been designed with the method of the present invention using the equation $n_a h_a = n_b h_b$ (equation 6, normal incidence) for the ratio of high-low index thicknesses. Using the proceedings above, an averaged efficiency of 99.9899% is calculated, weighted by the radiation spectral power density of a blackbody at 1410° C. within the 0.6-20 μm bandwidth and extending this weighted average to all hemispheric impinging angles and polarizations of the incident radiation. Following Stefan-Boltzmann's law, the radiation power of a blackbody at 1683K (1410° C.) is 45.5098 W/cm$^2$, the reflected power in the range of 0.6-20 μm, with the calculated average reflectance, is 45.3341 W/cm$^2$; the reflectance outside this range is estimated by us in 70% that for the leftmost range of 0-0.6 μm leads to a reflected power 0.0158632 W/cm$^2$ and for the rightmost range of 20-∞ μm to a reflected power of 0.150173 W/cm$^2$. The difference between the power incident and total three components of the power reflected is 0.00970275 W/cm$^2$, this being the power absorbed and lost in the thermal insulation of the lining. This power is easily dissipated to the ambient with no substantial elevation of the mirror's temperature. The typical losses in a refractory/insulating state-of-the-art lining are of more than 1 W/cm$^2$. Thus the present calculations give more than 100 times less thermal losses with the present mirror lining.

In an embodiment a part of the wrapper of mirrors are substituted by thermo-photovoltaic cells. In their manufacturing an integrated mirror of multiple photonic crystals may be deposited in the back face of the thermo-photovoltaic cell to reflect to the hot vessel many of the photons with energy too low as to produce photocurrent, and therefore almost not absorbed. In a thermo-photovoltaic cell adapted to convert the blackbody spectrum at the melting silicon temperature (1410° C.) the useless photons are of less than 0.7 eV, corresponding to a wavelength of 1.77 μm. The mirror is deposited on the back face of the semiconductor cell during the cell manufacturing and it is convenient to finish it with a silver or gold layer to form the back electric contact. Reflectance curves appear in FIG. 7 and their behaviour has been previously described in the present specification. As said there, a 0.999999 averaged hemispheric reflectance is obtained between 1.77 and 20 μm. However, the power reflected is today substantially less due to different losses in the thermo-photovoltaic cell but this result may stimulate important advances in thermo-photovoltaic efficiency.

In relation to coating with silver or gold the monolithic mirror of multiple photonic crystals, the zones of total reflection remain without variation but the zones outside them greatly increase their reflectance, although never as much as the zones of total reflection. This may have a practical interest in many applications.

In a different application, the monolithic mirror according to the invention can be used in parabolic mirrors of astronomical telescopes deposited in the hexagonal tesserae that usually constitute them and in which the small curvature of the tessera does not affect its manufacture. This mirror instead of only receiving light normal to the telescope within a moderate band of wavelengths, which can be achieved with a single photonic crystal, could operate receiving the light of the full firmament and with a very broad spectrum.

Many other applications may be envisaged for the mirrors designed and/or produced according to the present invention.

The invention claimed is:

1. A method of manufacturing a mirror having total reflectance in a predefined vacuum wavelength range ($[\lambda_A, \lambda_B]$) for incident unpolarized radiation with an angle of incidence ($\theta$) lower than or equal to a predefined maximum angle of incidence ($\theta_{max}$), comprising:

forming m stacked one-dimensional photonic crystals, wherein for each i-th photonic crystal a first dielectric material and a second dielectric material are selected, wherein each i-th photonic crystal is formed by stacking a plurality of alternate layers of the first dielectric material having a first thickness, and the second dielectric material having a second thickness, the first dielectric material having an index of refraction different than the index of refraction of the second dielectric material;

wherein each photonic crystal comprises a plurality of unit cells repeated identically a prescribed number of times, each unit cell comprising a layer of the first dielectric material and a layer of the second dielectric material, wherein the reflectance of each photonic crystal as a function of vacuum wavelength ($\lambda_0$) shows the shape of a rectangular pulse of unity height with rounded corners in an interval $$(\lambda_0^L, \lambda_0^T)$$

between a leading edge wavelength value $$(\lambda_0^L)$$

and a trailing edge wavelength value $$(\lambda_0^T),$$

said pulse in said interval being identified as total reflection band, the leading edge wavelength value and the trailing edge wavelength value being dependent on the angle of incidence ($\theta$) and on the polarization of the incident radiation, wherein for each i-th photonic crystal, a leading edge wavelength value $$(\lambda_{0l,i}^L)$$

of the total reflection band of the i-th photonic crystal is set for $\theta=0$, the first thickness ($h_{al,i}$) for the layer of first dielectric material of the i-th photonic crystal and the second thickness ($h_{bl,i}$) for the layer of second dielectric material of the i-th photonic crystal satisfy the following relationships:

$$h_{al,i} = \frac{\lambda_{0l,i}^L}{4\pi n_{al,i}} \left\{ 2\pi - \arccos \left[ \frac{\left(1 - \frac{n_{al,i}}{n_{bl,i}}\right)^2 - 4(n_{al,i}/n_{bl,i})}{\left(1 + (n_{al,i}/n_{bl,i})\right)^2} \right] \right\}$$

-continued $$h_{bl,i} = h_{al,i}(n_{al,i}/n_{bl,i})$$

wherein $n_{ai,l}$ and $n_{bl,i}$ are, respectively, the indices of refraction of the first dielectric material and the second dielectric material of the i-th photonic crystal, and wherein the trailing edge wavelength value $$(\lambda_{0l,i}^T)$$

of the total reflection band of the i-th photonic crystal is given by:

$$\lambda_{0l,i}^T = \frac{8 n_{al,i} h_{al,i} \cos(\theta_{al,i})}{X(1+r)}$$

wherein parameter X is obtained by solving in X the equation $\alpha_{TM}+1=0$ for the predefined maximum angle of incidence ($\theta_{max}$) and for transversal magnetic (TM) polarization, wherein said equation is solved by an iteration method whose initial value is X=1, wherein $$\alpha_{TM} = \cos(\pi X/2) \frac{(1+Z)^2}{4Z} - \cos(\pi r X/2) \frac{(1-Z)^2}{4Z}$$

$$Z = n_{bl,i} \cos(\theta_{al,i}) / (n_{ai,i} \cos(\theta_{bl,i}))$$

$$r = \frac{\cos^2(\theta_{al,i}) - \left(\frac{Z h_{bl,i}}{h_{al,i}}\right) \cos^2(\theta_{bl,i})}{\cos^2(\theta_{al,i}) + \left((Z h_{bl,i}/h_{al,i}) \cos^2(\theta_{bl,i})\right)}$$

$$\theta_{al,i} = \arcsin\left(\frac{\sin(\theta_{max})}{n_{al,i}}\right)$$

$$\theta_{bl,i} = \arcsin\left(\frac{\sin(\theta_{max})}{n_{bl,i}}\right)$$

wherein the leading edge wavelength value $$(\lambda_{0l,i}^L)$$

is set to:
a value equal to $\lambda_A$, for i=1, and
a value equal to the trailing edge wavelength value $$(\lambda_{0l,i-1}^T)$$

of the total reflection band of the (i−1)-th photonic crystal for $\theta=\theta_{max}$ and TM polarization, for i>1, wherein m is the number of the photonic crystal which fulfils that the trailing edge wavelength value $$(\lambda_{0l,m}^T)$$

of the total reflection band of said m-th photonic crystal for $\theta=\theta_{max}$ and TM polarization is equal to or greater than $\lambda_B$.

2. The method according to claim 1, wherein $\lambda_A$ is comprised in the visible or near infrared range and/or $\lambda_B$ is comprised in the medium infrared range.

3. The method according to claim 1, wherein the layers of the photonic crystals are deposited on a substrate.

4. The method according to claim 3, wherein the substrate is covered with a layer of a reflective metal and the photonic crystals are deposited on said layer.

5. The method according to claim 4, wherein the reflective metal is silver or gold.

6. The method according to claim 3, wherein the photonic crystals are arranged in the mirror in an order defined by the transparency of the first and second dielectric materials of the photonic crystals, such that photonic crystals made of a material not transparent to radiation in a wavelength range comprised in the total reflection band of another photonic crystal are placed downstream of said another photonic crystal in the direction intended for incoming radiation.

7. The method according to claim 1, wherein the layers of the photonic crystals are covered with a protective thick transparent layer.

8. The method according to claim 7, wherein the protective thick transparent layer is transparent in the range [$\lambda_A$, $\lambda_B$].

9. The method according to claim 1, wherein:

(a) the photonic crystals are arranged in the mirror in the order defined by the position of their total reflection bands from $\lambda_A$ to $\lambda_B$, or (b) the photonic crystals are arranged in the mirror in an order different to the order defined by the position of their total reflection bands from $\lambda_A$ to $\lambda_B$.

10. The method according to claim 1, wherein the number of unit cells in each photonic crystal is greater than or equal to 5.

11. The mirror manufactured according to the method of claim 1, wherein m>1 and the predefined maximum angle of incidence ($\theta_{max}$) is $0.99 \times \pi/2$.

12. A photovoltaic cell comprising the mirror manufactured according to claim 1, wherein m>1 and the predefined maximum angle of incidence ($\theta_{max}$) is $0.99 \times \pi/2$, wherein the mirror is deposited on a transparent substrate and coated with a metal layer, the photovoltaic cell being a thermo-photovoltaic cell.

13. A photovoltaic cell comprising the mirror manufactured according to claim 1, wherein m>1 and the predefined maximum angle of incidence ($\theta_{max}$) is $0.99 \times \pi/2$; and a semiconductor substrate, wherein the mirror is deposited on a back face of the semiconductor substrate and coated with a metal layer, and the photovoltaic cell is a thermo-photovoltaic cell.

14. A thermal insulation for an incandescent body, wherein the thermal insulation comprises at least one mirror manufactured according to claim 1, wherein m>1 and the predefined maximum angle of incidence ($\theta_{max}$) is $0.99 \times \pi/2$.

15. The method according to claim 1, wherein the number of unit cells in each photonic crystal is greater than or equal to 7.

16. The method according to claim 1, wherein the number of unit cells in each photonic crystal is greater than or equal to 10.

17. The method according to claim 1, wherein the predefined maximum angle of incidence ($\theta_{max}$) is $<\pi/2$.

18. The method according to claim 17, wherein the predefined maximum angle of incidence ($\theta_{max}$) is $0.99 \times \pi/2$.

19. A method of manufacturing a mirror having maximum reflectance in a predefined vacuum wavelength range ([$\lambda_A$, $\lambda_B$]) for incident unpolarized radiation with an angle of incidence ($\theta$) lower than or equal to a predefined maximum angle of incidence ($\theta_{max}$), comprising:

forming m stacked one-dimensional photonic crystals, wherein for each i-th photonic crystal a first dielectric material and a second dielectric material are selected, wherein each i-th photonic crystal is formed by stacking a plurality of alternate layers of the first dielectric material having a first thickness, and the second dielectric material having a second thickness, the first dielectric material having an index of refraction different than the index of refraction of the second dielectric material;

wherein each photonic crystal comprises a plurality of unit cells repeated identically a prescribed number of times, each unit cell comprising a layer of the first dielectric material and a layer of the second dielectric material, wherein the reflectance of each photonic crystal as a function of vacuum wavelength ($\lambda_0$) shows the shape of a rectangular pulse of unity height with rounded corners in an interval $$(\lambda_0^L, \lambda_0^T)$$

between a leading edge wavelength value $$(\lambda_0^L)$$

and a trailing edge wavelength value $$(\lambda_0^T),$$

said pulse in said interval being identified as total reflection band, the leading edge wavelength value and the trailing edge wavelength value being dependent on the angle of incidence ($\theta$) and on the polarization of the incident radiation, wherein for each i-th photonic crystal, a trailing edge wavelength value $$(\lambda_{0t,i}^T)$$

of the total reflection band of the i-th photonic crystal is set for $\theta=\theta_{max}$ and TM polarization, the first thickness ($h_{at,i}$) for the layer of first dielectric material of the i-th photonic crystal and the second thickness ($h_{bt,i}$) for the layer of second dielectric material of the i-th photonic crystal satisfy the following relationships:

$$h_{at,i} = \frac{\lambda_{0t,i}^T}{4\pi n_{at,i}} \times$$

$$\left\{ \arccos\left[ \frac{(1 - n_{bt,i}\cos(\theta_{at,i})/(n_{at,i}\cos(\theta_{bt,i})))^2 - 4n_{bt,i}\cos(\theta_{at,i})/(n_{at,i}\cos(\theta_{bt,i}))}{(1 + n_{bt,i}\cos(\theta_{at,i})/(n_{at,i}\cos(\theta_{bt,i})))^2} \right] \right\}$$

$$h_{bt,i} = h_{at,i} n_{at,i}\cos(\theta_{at,i})/(n_{bt,i}\cos(\theta_{bt,i}))$$

wherein $n_{at,i}$ and $n_{bt,i}$ are, respectively, the indices of refraction of the first dielectric material and the second dielectric material of the i-th photonic crystal, wherein $$\theta_{at,i} = \arcsin\left(\frac{\sin(\theta_{max})}{n_{at,i}}\right)$$

$$\theta_{bt,i} = \arcsin\left(\frac{\sin(\theta_{max})}{n_{bt,i}}\right)$$

and
    wherein the leading edge wavelength value $$\left(\lambda_{0r,i}^{L}\right)$$

of the total reflection band of the i-th photonic crystal is given by:

$$\lambda_{0r,i}^{L} = \frac{8 n_{at,i} h_{at,i}}{X(1+r)}$$

wherein parameter X is obtained by solving in X the equation $\alpha_{TM}+1=0$ for $\theta=0$, wherein said equation is solved by an iteration method whose initial value is X=3, wherein $$\alpha_{TM} = \cos(\pi X/2)\frac{(1+Z)^2}{4Z} - \cos(\pi r X/2)\frac{(1-Z)^2}{4Z}$$

$$Z = n_{bt,i}/n_{at,i}$$

-continued
$$r = \frac{1 - \left(Z h_{bt,i}/h_{at,i}\right)}{1 + \left(Z h_{bt,i}/h_{at,i}\right)}$$

wherein the trailing edge wavelength value $$\left(\lambda_{0r,i}^{T}\right)$$

is set to:
    a value equal to $\lambda_B$, for i=1, and
    a value equal to the leading edge wavelength value of the total reflection band of the (i−1)-th photonic crystal for $\theta=0$, for i>1,
    wherein m is the number of the photonic crystal which fulfils that the leading edge wavelength value $$\left(\lambda_{0r,m}^{L}\right)$$

of the total reflection band of said m-th photonic crystal for $\theta=0$ is equal to or smaller than $\lambda A$.

20. The method according to claim 19, wherein $\lambda_A$ is comprised in the visible or near infrared range and/or $\lambda_B$ is comprised in the medium infrared range.

21. The method according to claim 19, wherein the predefined maximum angle of incidence ($\theta_{max}$) is $<\pi/2$.

22. The method according to claim 21, wherein the predefined maximum angle of incidence ($\theta_{max}$) is $0.99\times\pi/2$.

23. The mirror manufactured according to the method of claim 19, wherein m>1 and the predefined maximum angle of incidence ($\theta_{max}$) is $0.99\times\pi/2$.

* * * * *